(12) United States Patent
Lee

(10) Patent No.: US 7,011,924 B2
(45) Date of Patent: Mar. 14, 2006

(54) PHOTORESIST POLYMERS AND PHOTORESIST COMPOSITIONS COMPRISING THE SAME

(75) Inventor: Geun Su Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 16 days.

(21) Appl. No.: 10/865,731

(22) Filed: Jun. 10, 2004

(65) Prior Publication Data
US 2005/0026071 A1 Feb. 3, 2005

(30) Foreign Application Priority Data
Jul. 30, 2003 (KR) ...................... 10-2003-0052757
Sep. 29, 2003 (KR) ...................... 10-2003-0067496
Oct. 6, 2003 (KR) ...................... 10-2003-0069238

(51) Int. Cl.
G03F 7/004 (2006.01)
(52) U.S. Cl. ...................... 430/270.1; 430/326; 526/72; 525/50
(58) Field of Classification Search ............. 430/270.1, 430/326; 525/50; 526/72
See application file for complete search history.

(56) References Cited

U.S. PATENT DOCUMENTS 6,403,281 B1 * 6/2002 Lee et al. ................. 430/270.1
6,818,376 B1 * 11/2004 Lee et al. ................. 430/270.1

2003/0044840 A1 * 3/2003 Hall ........................... 435/7.1

FOREIGN PATENT DOCUMENTS

JP 2004331966 A * 11/2004
WO WO 200483263 A1 * 9/2004

* cited by examiner

Primary Examiner—Amanda Walke
(74) Attorney, Agent, or Firm—Marshall, Gerstein & Borun LLP

(57) ABSTRACT

Photoresist polymers and photoresist compositions containing the same are disclosed that comprise a chain linking compound including an alcohol group and a boron compound represented by Formula 1 as a moiety. As a result, the photoresist polymer and the photoresist composition containing the same have excellent transmissivity, etching resistance, thermal resistance and adhesive property, low light absorbance and high affinity to an developing solution at a wavelength of 13 nm as well as 248 nm and 157 nm, thereby reducing line edge roughness (LER).

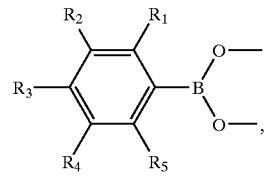

Formula 1 wherein $R_1$, $R_2$, $R_3$, $R_4$ and $R_5$ are as defined in the specification.

40 Claims, 8 Drawing Sheets

PHOTORESIST POLYMERS AND PHOTORESIST COMPOSITIONS COMPRISING THE SAME

BACKGROUND

1. Technical Field

Photoresist polymers and photoresist compositions are disclosed that comprise a compound including an alcohol group and a boron compound represented by Formula 1 as a moiety. The disclosed photoresist polymer and the photoresist composition comprising the same have excellent transmissivity, etching resistance, thermal resistance and adhesive property, low light absorbance and high affinity to an developing solution at a wavelength of 13 nm as well as 248 nm and 157 nm, thereby improving line edge roughness (LER).

2. Description of the Related Art

For use with ArF and vacuum ultraviolet (VUV) resists, photoresist polymers and photoresist compositions must have low light absorbance at wavelengths of 193 nm and 157 nm, excellent etching resistance and excellent adhesive property to the substrate. Further, they need to be developed with a standard TMAH solution of 2.38 wt % and 2.6 wt %.

Recently, much research has been conducted on resins having a high transparency at 248 nm and 193 nm wavelengths and etching resistance similar to novolac resin.

However, since the thickness of resist materials is reduced as semiconductor circuits become more microscopic, it is difficult to improve the LER of the photoresist patterns.

LER problems occur more frequently in ArF resist patterns than in conventional KrF or I-line resist patterns. The conventional KrF or I-line resist materials include acidic alcohol groups while most ArF resist materials do not include acidic alcohol group. As a result, since ArF resist materials have low affinity to basic developing solutions, LER occurs more frequently with ArF resist materials.

This phenomenon occurs more severely when patterns are formed using a chemically amplified photoresist. LER degrades stability and yield of semiconductor end products.

SUMMARY OF THE DISCLOSURE

Photoresist polymers and photoresist compositions containing the same are disclosed that have excellent transmissivity, etching resistance, thermal resistance and adhesive property, low light absorbance and high affinity to an developing solution, thereby reducing the LER problem associated with prior art photoresist polymers and compositions.

DETAILED DESCRIPTION OF THE PRESENTLY PREFERRED EMBODIMENTS

Figure 1:
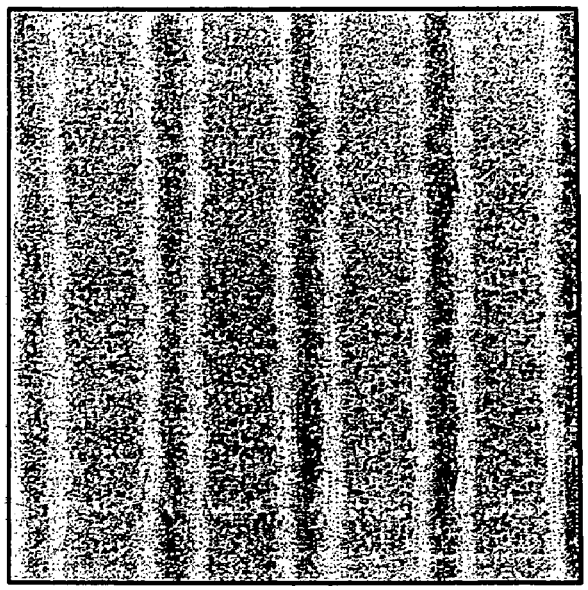
FIG. 1 is a photograph showing a photoresist pattern obtained from Example 17.

Photoresist polymers comprising an additional polymerization unit which is a polymerized acidic alcohol group-containing compounds in a main chain are disclosed. Here, the main chain comprises a polymer including a side-chained boron compound as a moiety. Also, a photoresist composition containing the disclosed polymer and a method for forming a photoresist pattern using the same are disclosed.

Preferably, the acidic alcohol group is selected from the group consisting of a cyclo-olefin compound, a hydroxystyrene compound and a phenol compound.

The disclosed polymer has a main chain including an additional polymerization of a cyclo-olefin compound. Here, the main chain comprises a side-chained moiety of Formula 1:

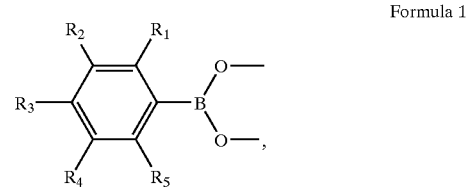

Formula 1 wherein
$R_1$, $R_2$, $R_3$, $R_4$ and $R_5$ are individually H, F, $CF_3$ or a $C_1$–$C_5$ alkyl group.

Preferably, the moiety of Formula 1 is selected from the group consisting of Formulas 1a to 1d;

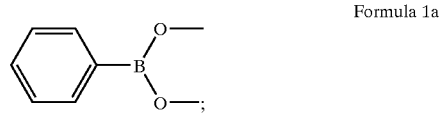

Formula 1a

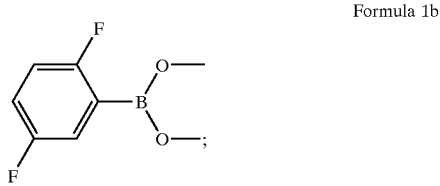

Formula 1b

-continued

Formula 1c

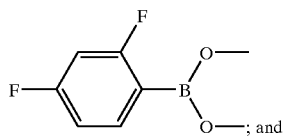; and

Formula 1d

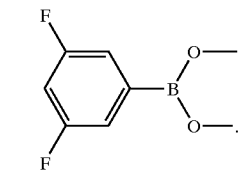.

The moiety of Formula 1 is present in an amount ranging from 1 to 30 mol %, preferably from 5 to 25 mol %, based on the whole polymer, and is side-chained to two main chains, thereby cross-linking two main chains using the moiety of Formula 1 (see, e.g., Formulas 3–4, 6–7, 11, and 13).

Here, the additional polymerization unit of the cyclo-olefin compound is represented by Formula 2:

Formula 2

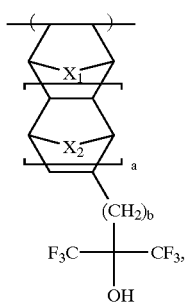

wherein
$X_1$ and $X_2$ are individually $CH_2$, O or S;
a is an integer ranging from 0 to 2; and b is 0 or 1.
Preferably, the Formula 2 is represented by Formula 2a:

Formula 2a

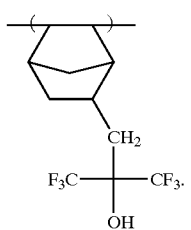

A disclosed polymer comprises an additional polymerization unit of the cyclo-olefin compound represented by Formula 2 and the compound of Formula 1 and includes polymerization repeating units of Formulas 3 or 4:

Formula 3

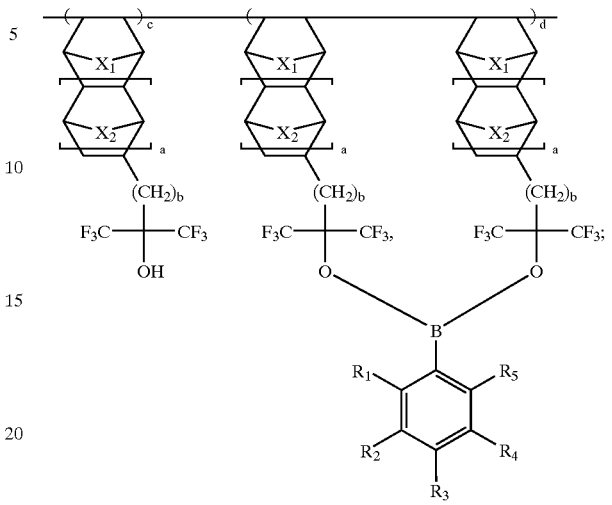

Formula 4

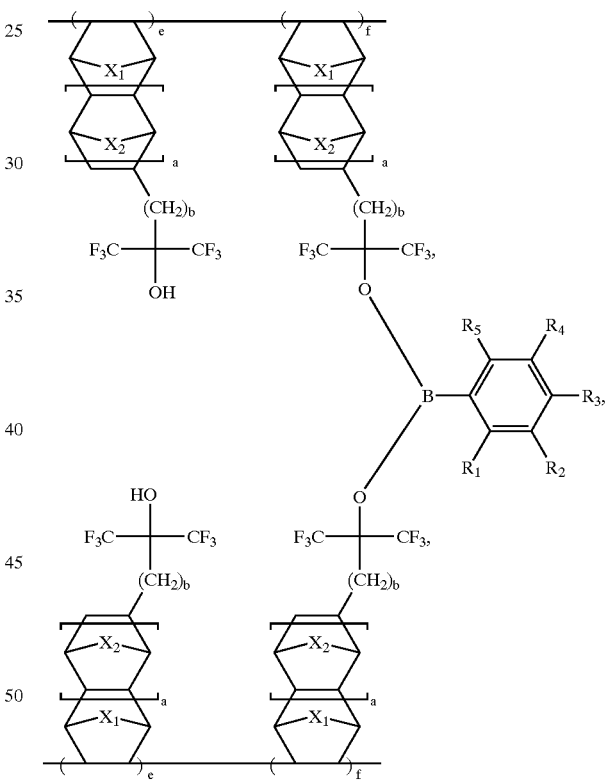

wherein
$X_1$ and $X_2$ are individually $CH_2$, O or S;
$R_1$, $R_2$, $R_3$, $R_4$ and $R_5$ are individually H, F, $CH_3$ or a $C_1$–$C_5$ alkyl group;
a is an integer ranging from 0 to 2;
b is 0 or 1;
the relative ratio of c:d in the range of 60~90 mol %:10~40 mol %; and
the relative ratio of e:f in the range of 60~90 mol %:10~40 mol %.

The polymerization repeating unit of Formula 3 may be selected from the group consisting of Formulas 3a to 3d:

Formula 3a
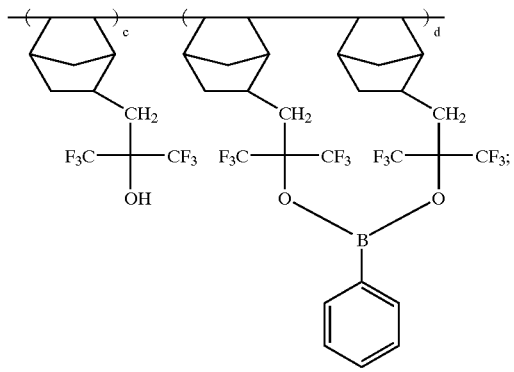
Formula 3b
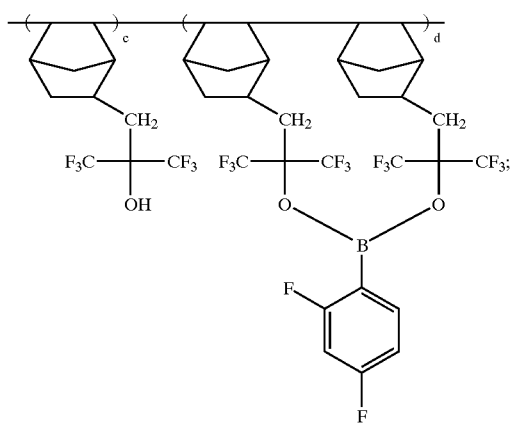
Formula 3c
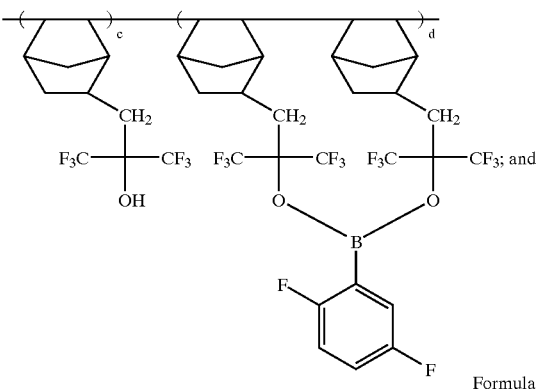
Formula 3d
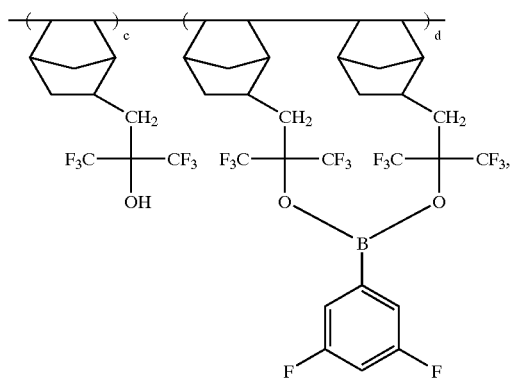
wherein the relative ratio of o:p in the range of 60~90 mol %:10~40 mol %.
Preferably, the polymerization repeating unit of Formula 4 is selected from the group consisting of Formulas 4a to 4d:
Formula 4a
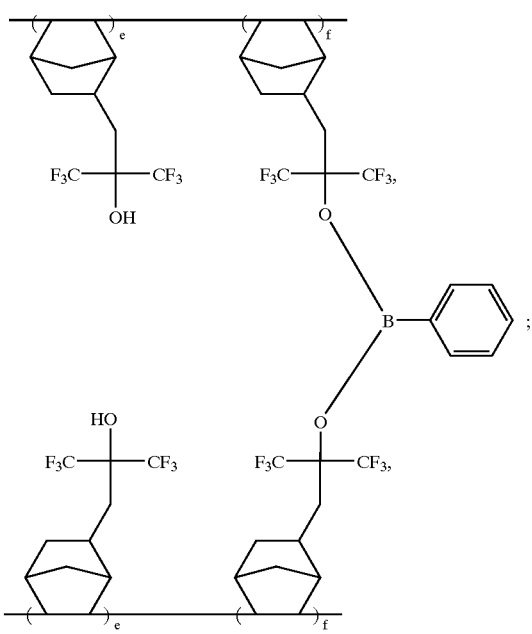
Formula 4b
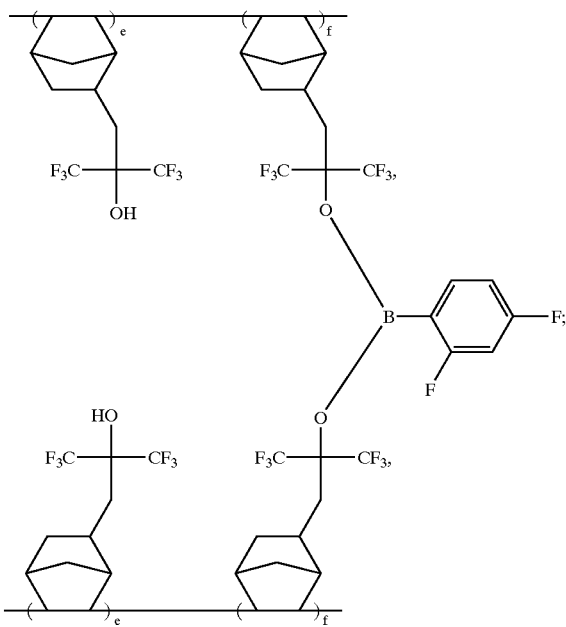

-continued

Formula 4c

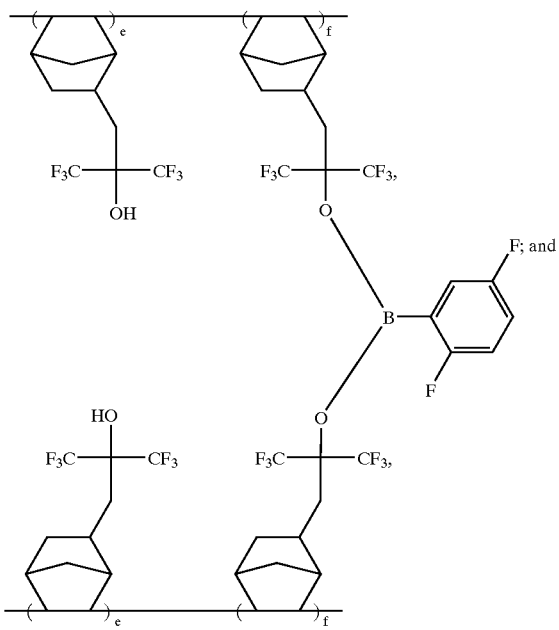

Formula 4d

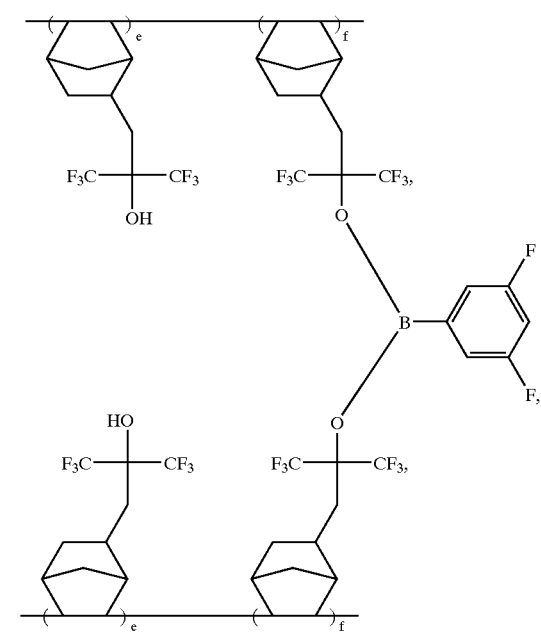

wherein the relative ratio of e:f in the range of 60~90 mol %:10~40 mol %.

The disclosed polymer has a main chain including an additional polymerization of a hydroxystyrene compound instead of the cyclo-olefin compound. Here, the main chain comprises the side-chained moiety of Formula 1.

The additional polymerization unit of the hydroxystyrene compound is represented by Formula 5:

Formula 5

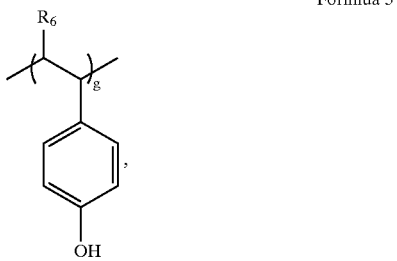

wherein $R_6$ is H or $CH_3$; and g is an integer ranging from 10 to 150.

Preferably, the compound of Formula 5 is represented by Formula 5a:

Formula 5a

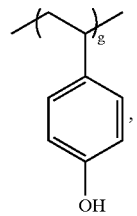

wherein g is an integer ranging from 10 to 150.

The disclosed polymer comprising an additional polymerization unit of the hydroxystyrene compound represented by Formula 5 and the compound of Formula 1 includes polymerization repeating units of Formulas 6 and 7:

Formula 6

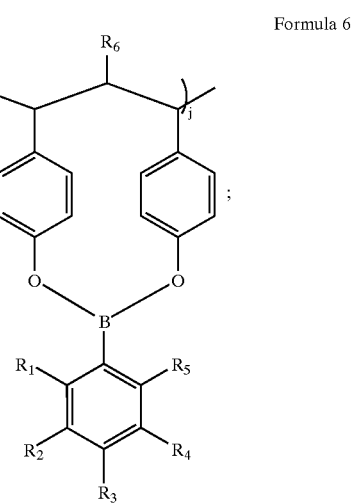

Formula 7

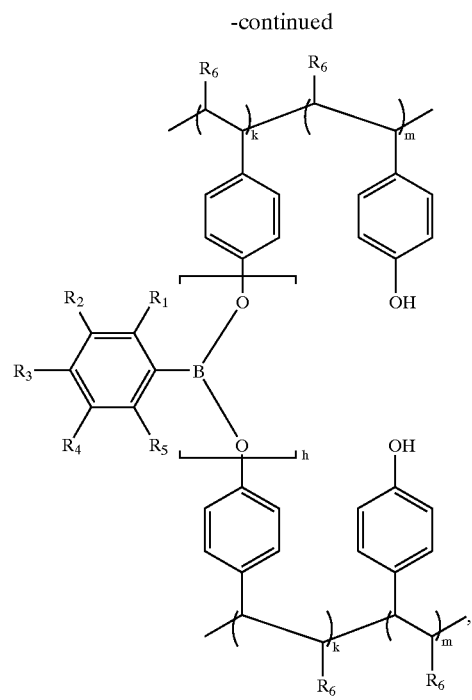

wherein $R_1$, $R_2$, $R_3$, $R_4$ and $R_5$ are individually H, F, $CF_3$ or a $C_1$–$C_5$ alkyl group;

$R_6$ is H or $CH_3$;

h is 1 or 2;

the relative ratio of i:j in the range of 60~90 mol %:10~40 mol %; and the relative ratio of k:m in the range of 10~40 mol %:60~90 mol %.

Preferably, the polymerization repeating unit of Formula 6 is selected from the group consisting of Formulas 6a to 6d:

Formula 6a

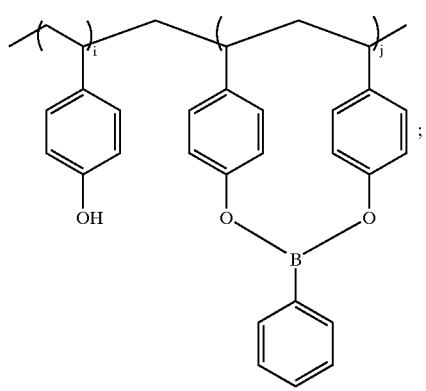

Formula 6b

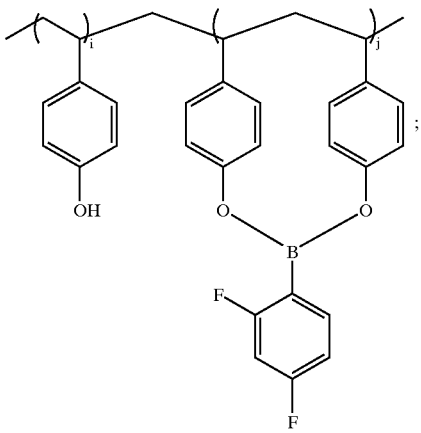

Formula 6c

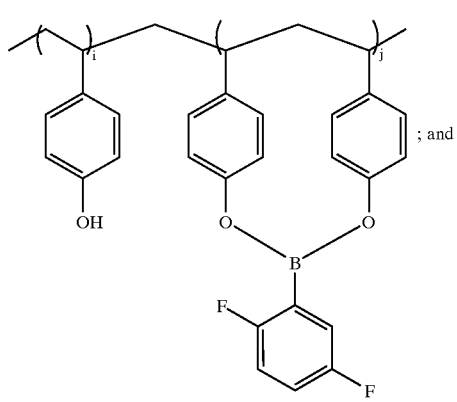

Formula 6d

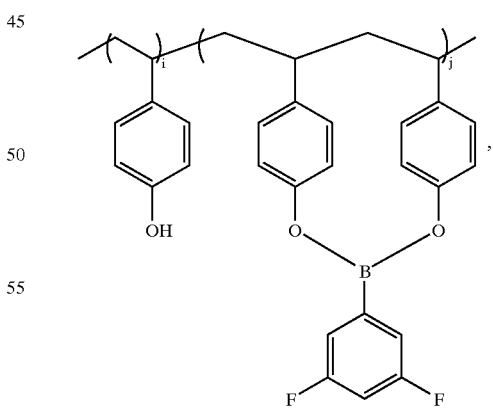

wherein the relative ratio of i:j in the range of 60~90 mol %:10~40 mol %.

Preferably, the polymerization repeating unit of Formula 7 is selected from the group consisting of Formulas 7a to 7d:

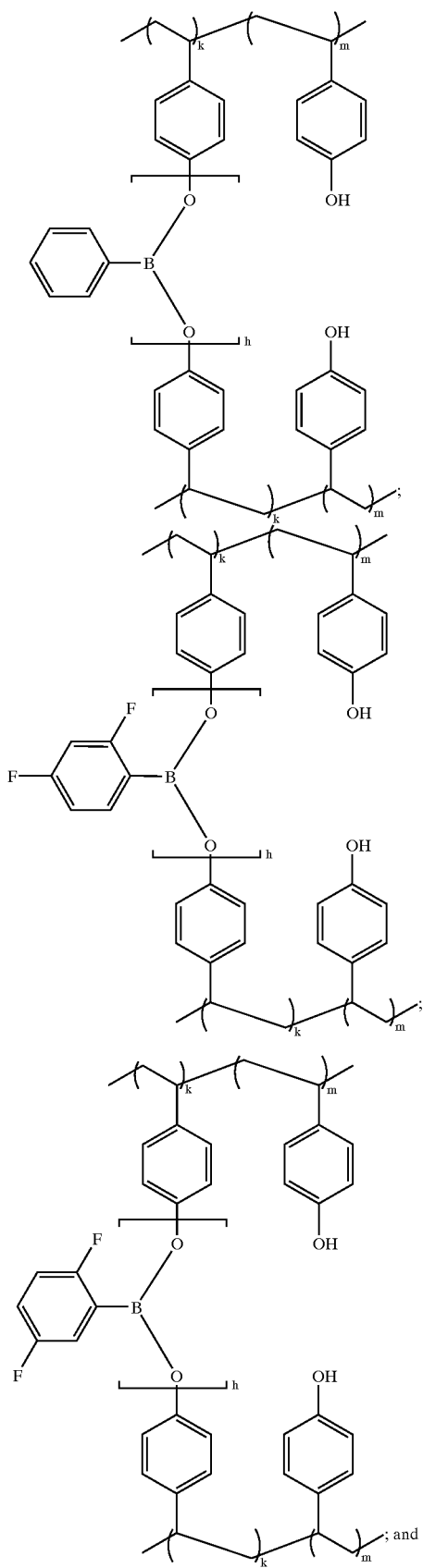

Formula 7a

Formula 7b

Formula 7c

-continued

Formula 7d wherein h is 1 or 2; and the relative ratio of k:m in the range of 10~40 mol %:60~90 mol %.

The disclosed polymer has a main chain including an additional polymerization unit of a phenol compound instead of the cyclo-olefin compound, and the moiety of Formula 1 is side-chained in a hydroxyl end of the additional polymerization unit of the phenol compound.

Here, an additional polymerization unit of the phenol is represented by Formulas 8 and 9:

Formula 8

Formula 9 wherein $R_7$, $R_8$, $R_9$, $R_{10}$, $R_{11}$, $R_{12}$ and $R_{13}$ are individually H or a $C_1$–$C_5$ alkyl group; and n and o are individually an integer ranging from 10 to 150.

Preferably, the Formula 8 or 9 is represented by Formula 8a or 9a:

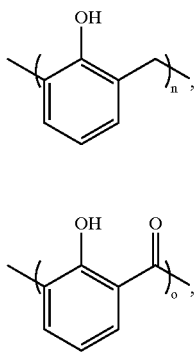

Formula 8a

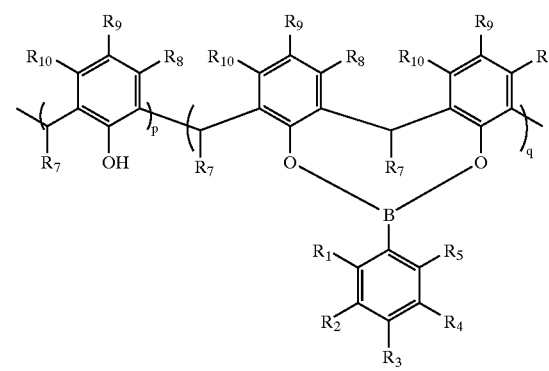

Formula 9a wherein n and o are individually an integer ranging from 10 to 150.

The disclosed polymer comprising the additional polymerization unit of Formula 8 or 9 and the compound of Formula 1 includes one or more polymerization repeating units of Formulas 10 or 13:

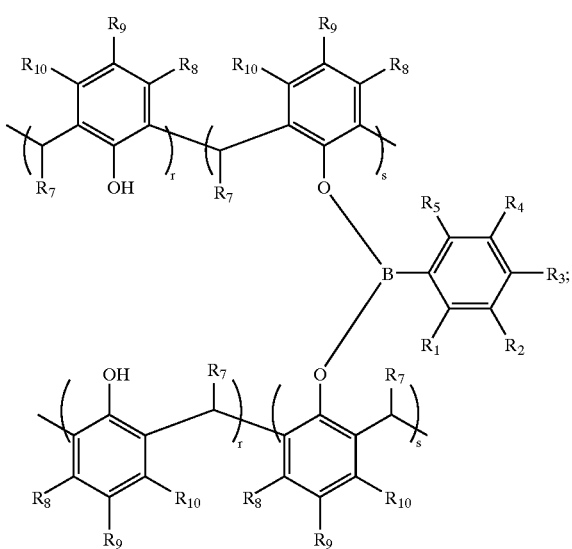

Formula 10

Formula 11

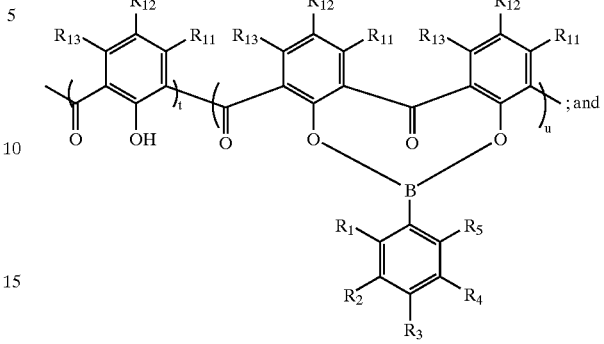

Formula 12

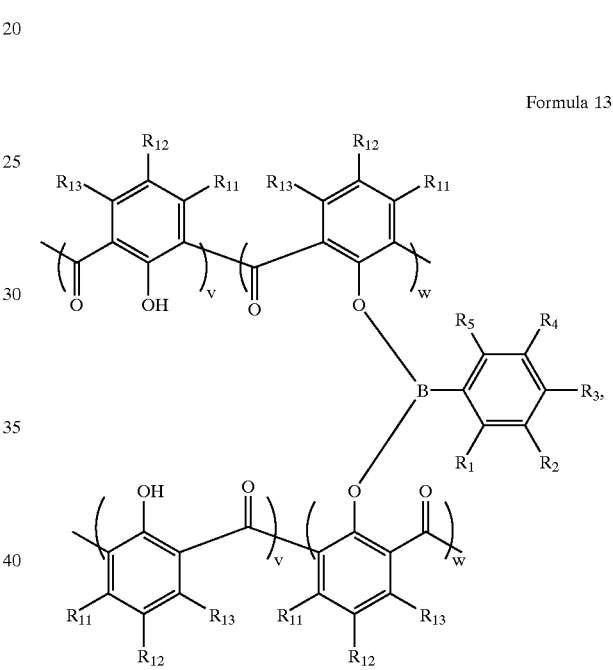

Formula 13 wherein $R_1$, $R_2$, $R_3$, $R_4$ and $R_5$ are individually H, F, $CF_3$ or a $C_1$–$C_5$ alkyl group;

$R_7$, $R_8$, $R_9$ and $R_{10}$ are individually H or a $C_1$–$C_5$ alkyl group;

the relative ratio of p:q f in the range of 60~90 mol %:10~40 mol %;

the relative ratio of r:s in the range of 60~90 mol %:10~40 mol %;

the relative ratio of t:u in the range of 60~90 mol %:10~40 mol %; and the relative ratio of v:w in the range of 60~90 mol %:10~40 mol %.

Preferably, the polymerization repeating unit of Formula 10 is selected from the group consisting of Formulas 10a to 10d:

Formula 10a
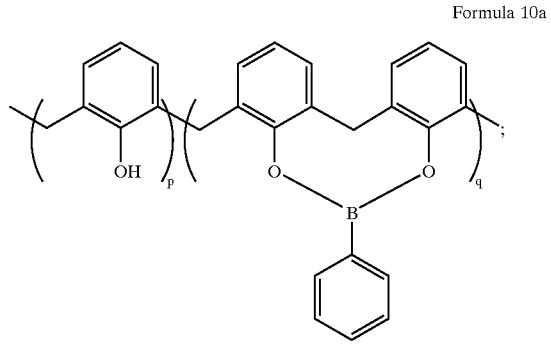
Formula 10b
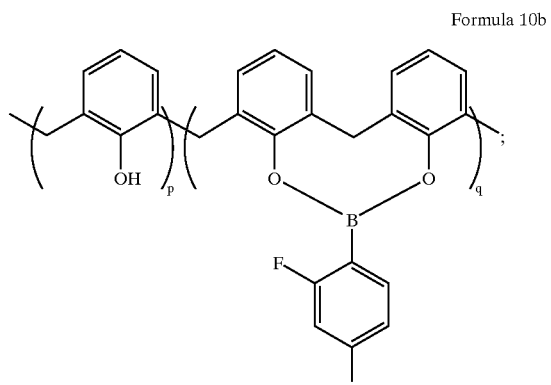
Formula 10c
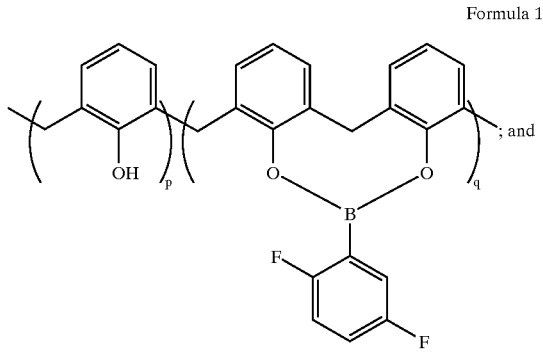
Formula 10d
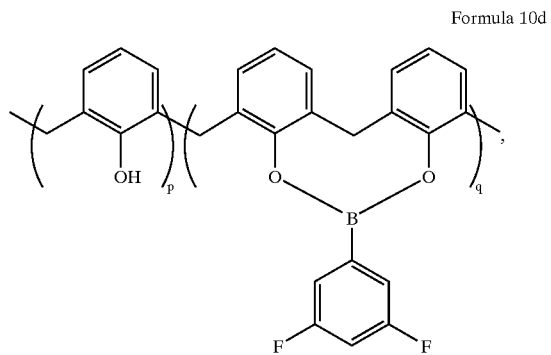
wherein the relative ratio of p:q in the range of 60~90 mol %:10~40 mol %.
Preferably, the polymerization repeating unit of Formula 11 is selected from the group consisting of Formulas 11a to 11d:
Formula 11a
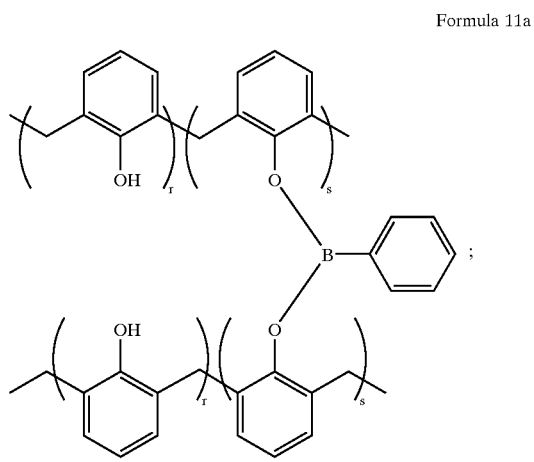
Formula 11b
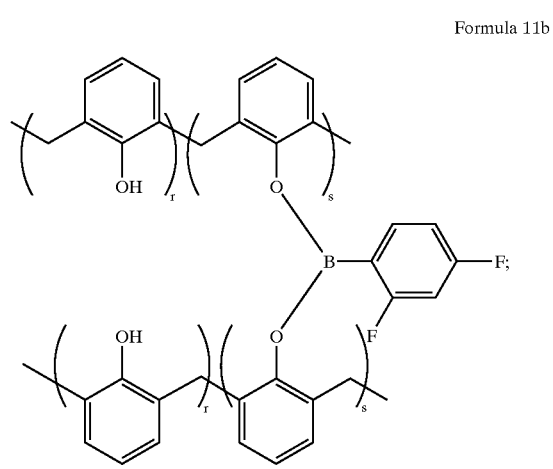
Formula 11c
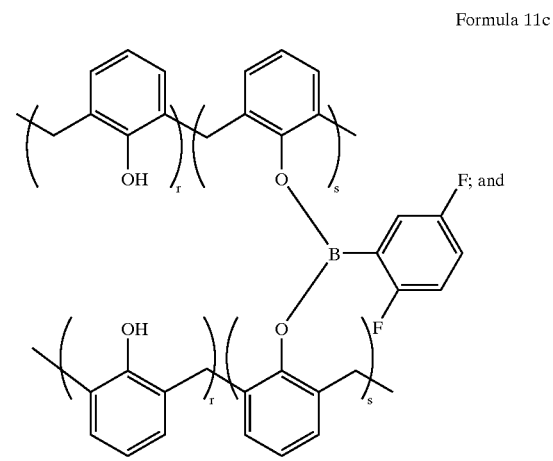

Formula 11d

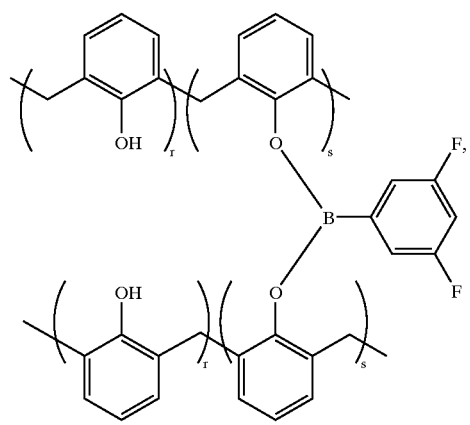

wherein the relative ratio of r:s in the range of 60~90 mol %:10~40 mol %.

Preferably, the polymerization repeating unit of Formula 12 is selected from the group consisting of Formulas 12a to 12d:

Formula 12a

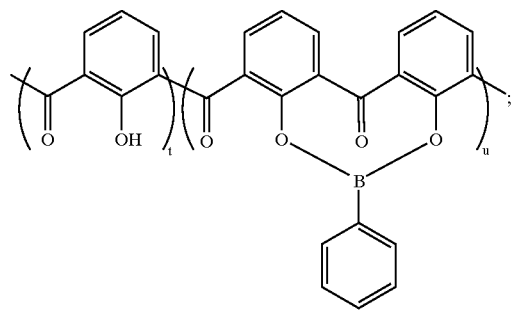

Formula 12b

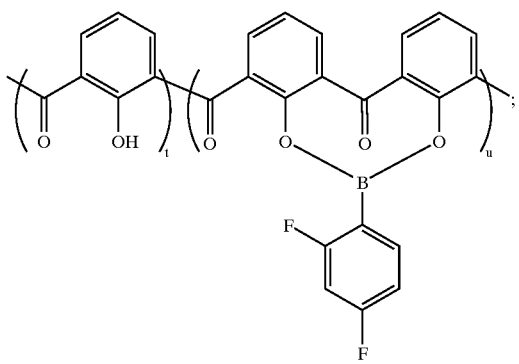

Formula 12c

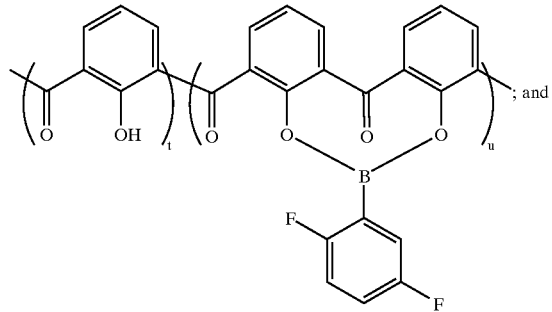

Formula 12d

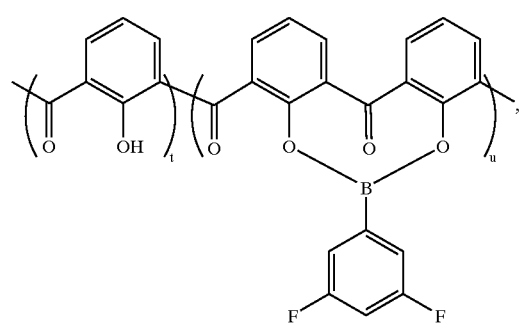

wherein the relative ratio of t:u in the range of 60~90 mol %:10~40 mol %.

Preferably, the polymerization repeating unit of Formula 13 is selected from the group consisting of Formulas 13a to 13d:

Formula 13a

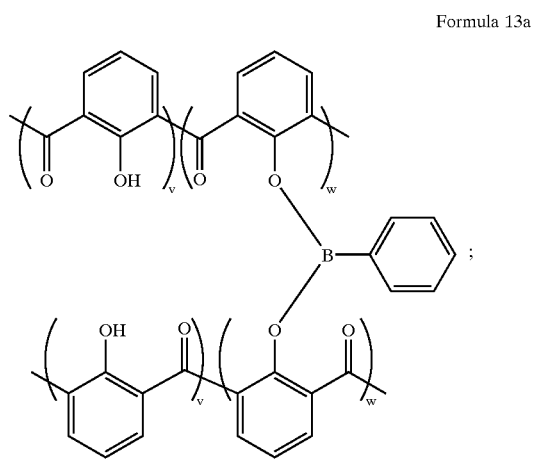

Formula 13b

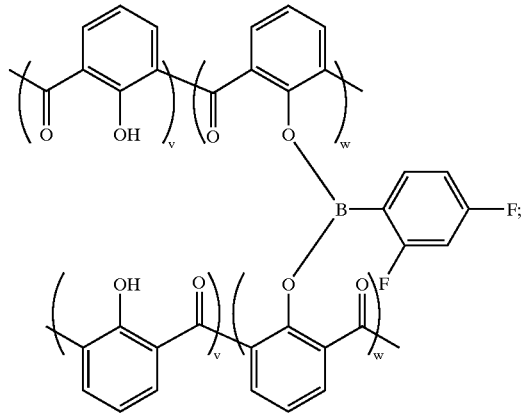

-continued

Formula 13c

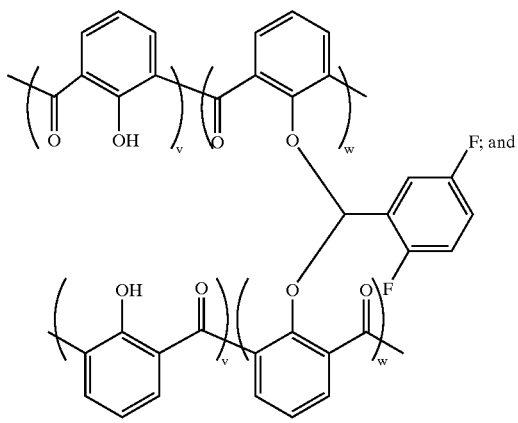

F; and

Formula 13d

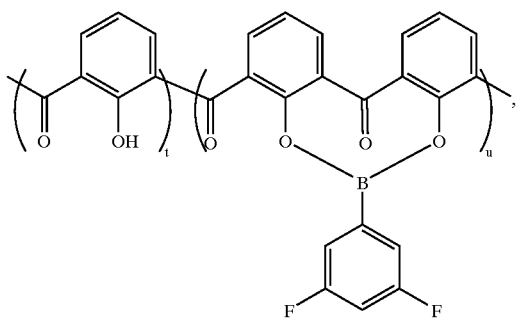

wherein the relative ratio of v:w in the range of 60~90 mol %:10~40 mol %.

The disclosed polymer including an acidic alcohol group has high affinity to a basic developing solution. In addition, the disclosed polymer comprising boron and fluorine atoms reduces high light absorbance at 157 nm which is a problem of hybrid-type photoresist consisting of acrylate and cyclo-olefin groups, polyhydroxysteren-type or phenol-type photoresist.

A method for manufacturing a photoresist polymer comprises the steps of:

(a) mixing a compound of Formula 1e with an additional polymer selected from a group consisting of the compounds of Formulas 2, 5, 8 and 9 in an organic solvent; and (b) refluxing and dehydrating the resulting mixture to obtain one of the above-described polymerization repeating unit:

Formula 1e

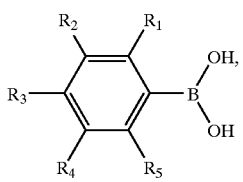

wherein $R_1$, $R_2$, $R_3$, $R_4$ and $R_5$ are individually H, F, $CH_3$ or a $C_1$–$C_5$ alkyl group.

In the above reaction, the homo-polymer additional polymer selected from the group consisting of compounds of Formulas 2, 5, 8 or 9 is soluble in a readily available developing solution. However, the cross-reaction occurs by condensation reaction with the moiety of Formula 1 or a part of a hydroxyl group is substituted with a protecting group, thereby generating a polymer which is insoluble in readily available developing solutions. In the polymer, the bond of the —O—B—O— part is broken by acids generated from the exposure process, and

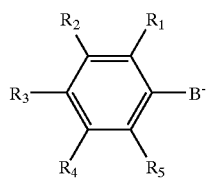

group is separated. As a result, the polymer is dissolved in the organic solvent.

The disclosed polymer obtained from the condensation reaction comprises one or more polymerization repeating units selected from the group consisting of Formulas 3 and 4, Formulas 6 and 7, Formulas 10 and 13 and mixtures thereof. These polymerization repeating units are not separated but prepared a photoresist composition, and vice versa.

Also, a photoresist composition comprising the photoresist polymer fabricated by the condensation reaction, a photoacid generator and an organic solvent is disclosed.

Here, the photoresist composition may further comprise a vinylene or acryl polymer.

Any of conventional photoacid generators, which are able to generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Sulfide type or onium type compounds are primarily used for the photoacid generator. More preferably, the photoacid generator is selected from the group consisting of phthalimidotrifluoromethane sulfonate, dinitrobenzyl-tosylate, n-decyl disulfone and naphthylimido trifluoromethane sulfonate having low absorbance at 157 nm and 193 nm. Also, the photoacid generator may be further selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluoroarsenate, triphenylsulfonium hexafluoroantimonate, triphenylsulfonium triflate and dibutylnaphthylsulfonium triflate. The photoacid generator is preferably present in an amount ranging from 0.05 to 10 wt % based upon the amount of the photoresist polymer present. If the photoresist generator is present in the amount of less than 0.05 wt %, it lowers photosensitivity of the photoresist composition to light. If the photoacid generator is present in the amount of more than 10 wt %, it results in a poor pattern formation due to its high absorption of far ultraviolet rays to generate a large amount of acids.

Practically any organic solvent can be used. Some of conventional organic solvents are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132, 926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the organic solvent is selected from the group consisting of diethylene glycol diethyl ether, methyl 3-methoxypropionate, ethyl 3-ethoxypropionate, propyleneglycol methyletheracetate, cyclohexanone, 2-heptanone and mixtures thereof. The organic solvent is present in an amount ranging from 500 to 2000 wt % to the photoresist polymer in order to obtain a desired thickness of the photoresist film. For example, the thickness of the photoresist film is about 0.25 $\mu$m when the organic solvent is present in the amount of about 1000 wt % based upon the amount of the photoresist polymer present.

A method for forming a photoresist pattern comprises the steps of:

(a) coating the disclosed photoresist composition on an underlying layer to form a photoresist film;

(b) exposing the photoresist film to light;

(c) baking the exposed photoresist film; and (d) developing the resulting mixture to obtain a photoresist pattern.

The above method may further comprise performing a bake process before exposure of the part (b). Here, the bake process is performed at a temperature ranging from 70 to 200° C.

The exposure process is performed using the source of light of step (b) selected from the group consisting of KrF, EUV (Extreme Ultra Violet), VUV (Vacuum Ultra Violet), E-beam, X-ray and ion beam as well as ArF with exposure energy ranging from 0.1 to 100 mJ/cm$^2$.

The development of part (d) is preferably performed using an alkaline developing solution such as TMAH aqueous solution in an amount ranging from 0.01 to 5 wt %.

A semiconductor device manufactured according to the method described above is also disclosed.

The disclosed photoresist polymers and photoresist compositions containing the same will be described in greater detail by referring to examples below, which are not intended to be limiting.

I. Preparation of Photoresist Polymer

EXAMPLE 1

Synthesis of Compounds of Formulas 3a and 4a

To toluene (100 ml) were added the polymer comprising the compound of Formula 2a (0.1 M) and the compound of Formula 1a (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 3a and 4a (yield: 97%).

EXAMPLE 2

Synthesis of Compounds of Formulas 3b and 4b

To toluene (100 ml) were added the polymer comprising the compound of Formula 2a (0.1 M) and the compound of Formula 1b (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 3b and 4b (yield: 96%).

EXAMPLE 3

Synthesis of Compounds of Formulas 3c and 4c

To toluene (100 ml) were added the polymer comprising the compound of Formula 2a (0.1 M) and the compound of Formula 1c (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 3c and 4c (yield: 96%).

EXAMPLE 4

Synthesis of Compounds of Formulas 3d and 4d

To toluene (100 ml) were added the polymer comprising the compound of Formula 2a (0.1 M) and the compound of Formula 1d (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 3d and 4d (yield: 98%).

EXAMPLE 5

Synthesis of Compounds of Formulas 6a and 7a

To toluene (100 ml) were added the polymer comprising the compound of Formula 5a (0.1 M) and the compound of Formula 1a (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 6a and 7a (yield: 98%).

EXAMPLE 6

Synthesis of Compounds of Formulas 6b and 7b

To toluene (100 ml) were added the polymer comprising the compound of Formula 5a (0.1 M) and the compound of Formula 1b (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 6b and 7b (yield: 95%).

EXAMPLE 7

Synthesis of Compounds of Formulas 6c and 7c

To toluene (100 ml) were added the polymer comprising the compound of Formula 5a (0.1 M) and the compound of Formula 1c (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 6c and 7c (yield: 96%).

EXAMPLE 8

Synthesis of Compounds of Formulas 6d and 7d

To toluene (100 ml) were added the polymer comprising the compound of Formula 5a (0.1 M) and the compound of Formula 1d (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 6d and 7d (yield: 94%).

EXAMPLE 9

Synthesis of Compounds of Formulas 10a and 11a

To toluene (100 ml) were added the polymer comprising the compound of Formula 8a (0.1 M) and the compound of Formula 1a (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 10a and 11a (yield: 98%).

EXAMPLE 10

Synthesis of Compounds of Formulas 10b and 11b

To toluene (100 ml) were added the polymer comprising the compound of Formula 8a (0.1 M) and the compound of Formula 1b (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 10b and 11b (yield: 95%).

EXAMPLE 11

Synthesis of Compounds of Formulas 10c and 11c

To toluene (100 ml) were added the polymer comprising the compound of Formula 8a (0.1 M) and the compound of Formula 1 c (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 10c and 11c (yield: 96%).

EXAMPLE 12

Synthesis of Compounds of Formulas 10d and 11d

To toluene (100 ml) were added the polymer comprising the compound of Formula 8a (0.1 M) and the compound of Formula 1d (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 10d and 11d (yield: 94%).

EXAMPLE 13

Synthesis of Compounds of Formulas 12a and 13a

To toluene (100 ml) were added the polymer comprising the compound of Formula 9a (0.1 M) and the compound of Formula 1a (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 12a and 13a (yield: 98%).

EXAMPLE 14

Synthesis of Compounds of Formulas 12b and 13b

To toluene (100 ml) were added the polymer comprising the compound of Formula 9a (0.1 M) and the compound of Formula 1b (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 12b and 13b (yield: 95%).

EXAMPLE 15

Synthesis of Compounds of Formulas 12c and 13c

To toluene (100 ml) were added the polymer comprising the compound of Formula 9a (0.1 M) and the compound of Formula 1c (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 12c and 13c (yield: 96%).

EXAMPLE 16

Synthesis of Compounds of Formulas 12d and 13d

To toluene (100 ml) were added the polymer comprising the compound of Formula 9a (0.1 M) and the compound of Formula 1d (0.01 M). The resulting mixture was refluxed for 12 hours, and dehydrated with a dean-stark device. After reaction, the resulting mixture was cooled at room temperature, and the polymer was precipitated and filtered, thereby obtaining the polymer of mixed Formulas 12d and 13d (yield: 94%).

II. Preparation of Photoresist Compositions and Formation of Photoresist Patterns

EXAMPLE 17

To propyleneglycolmethyl ether acetate (PGMEA) (30 g) were added the polymer (2g) obtained from Example 1, phthalimidotrifluoromethane sulfonate (0.024 g) and triphenylsulfonium triflate (0.06 g) which are photoacid generators. The resulting mixture was filtered with a 0.20 μm filter, thereby obtaining a photoresist composition.

The photoresist composition was spin-coated on a silicon wafer to form a photoresist film, and soft-baked at 130° C. for 90 seconds. After baking, the photoresist was exposed to light using an ArF laser exposer, and then post-baked at 130° C. for 90 seconds. The baked wafer was developed in 2.38 wt % TMAH aqueous solution for 40 seconds to obtain 0.08 μm of L/S pattern (see FIG. 1).

EXAMPLE 18

Figure 2:
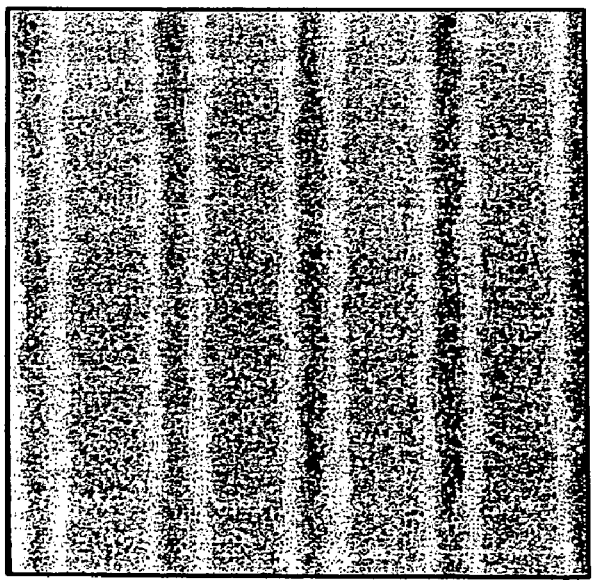
FIG. 2 is a photograph showing a photoresist pattern obtained from Example 18.

The procedure of Example 17 was repeated using the polymer (2 g) of Example 2 instead of the polymer of Example 1 to obtain the pattern of 0.08 μm of L/S pattern (see FIG. 2).

EXAMPLE 19

Figure 3:
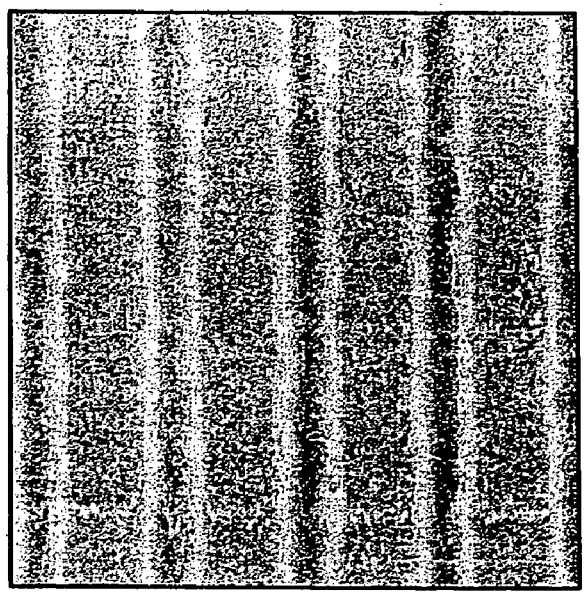
FIG. 3 is a photograph showing a photoresist pattern obtained from Example 19.

The procedure of Example 17 was repeated using the polymer (2 g) of Example 3 instead of the polymer of Example 1 to obtain the pattern of 0.08 μm of L/S pattern (see FIG. 3).

EXAMPLE 20

Figure 4:
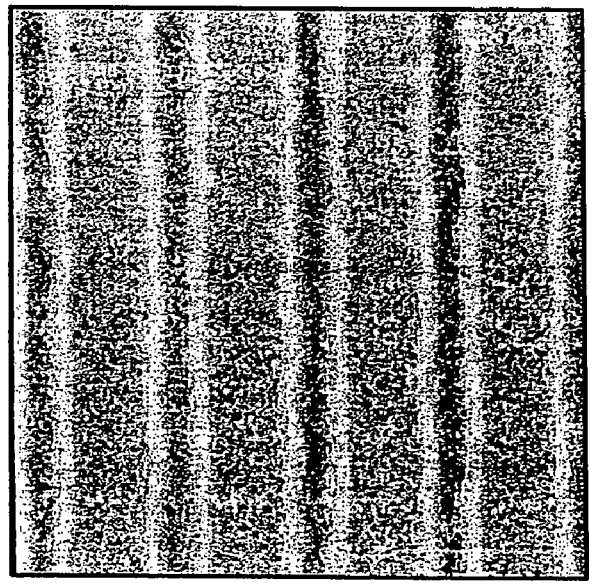
FIG. 4 is a photograph showing a photoresist pattern obtained from Example 20.

The procedure of Example 17 was repeated using the polymer (2 g) of Example 4 instead of the polymer of Example 1 to obtain the pattern of 0.08 μm of L/S pattern (see FIG. 4).

EXAMPLE 21

Figure 5:
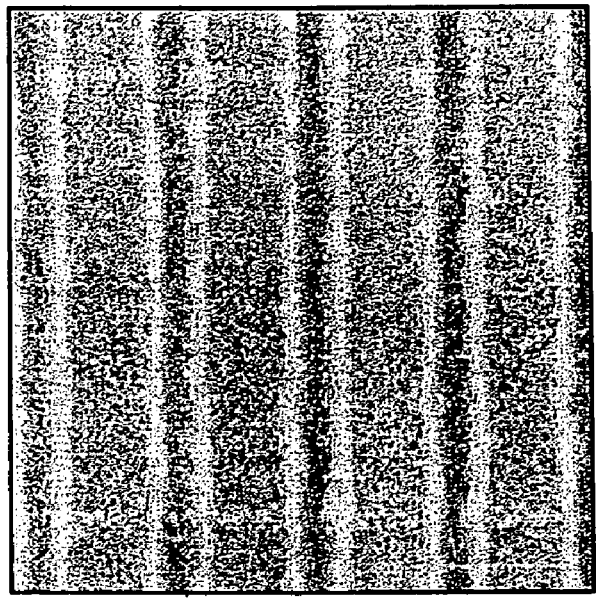
FIG. 5 is a photograph showing a photoresist pattern obtained from Example 21.

The procedure of Example 17 was repeated using the polymer (2 g) of Example 5 instead of the polymer of Example 1 to obtain the pattern of 0.10 μm of L/S pattern (see FIG. 5).

EXAMPLE 22

Figure 6:
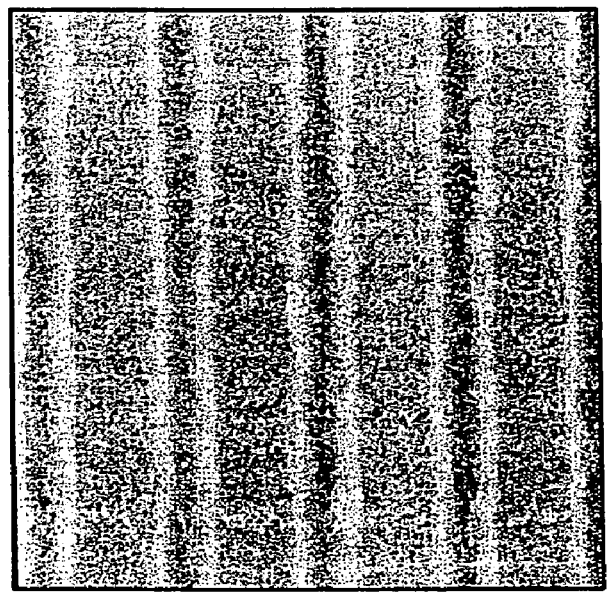
FIG. 6 is a photograph showing a photoresist pattern obtained from Example 22.

The procedure of Example 17 was repeated using the polymer (2 g) of Example 6 instead of the polymer of Example 1 to obtain the pattern of 0.10 μm of L/S pattern (see FIG. 6).

EXAMPLE 23

Figure 7:
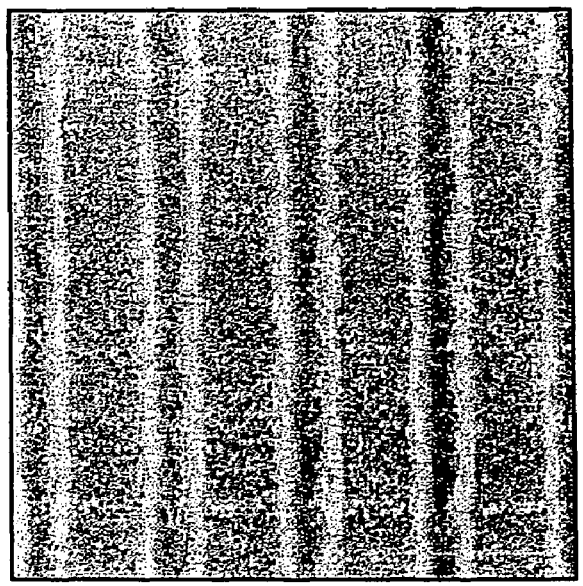
FIG. 7 is a photograph showing a photoresist pattern obtained from Example 23.

The procedure of Example 17 was repeated using the polymer (2 g) of Example 7 instead of the polymer of Example 1 to obtain the pattern of 0.10 μm of L/S pattern (see FIG. 7).

EXAMPLE 24

Figure 8:
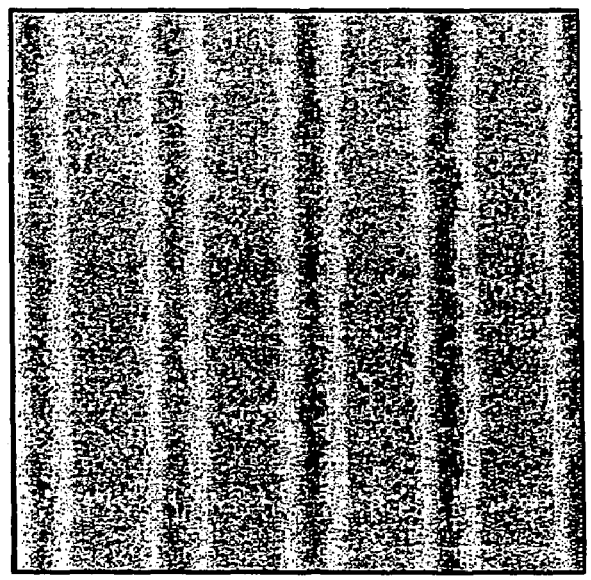
FIG. 8 is a photograph showing a photoresist pattern obtained from Example 24.

The procedure of Example 17 was repeated using the polymer (2 g) of Example 8 instead of the polymer of Example 1 to obtain the pattern of 0.10 μm of L/S pattern (see FIG. 8).

EXAMPLE 25

Figure 9:
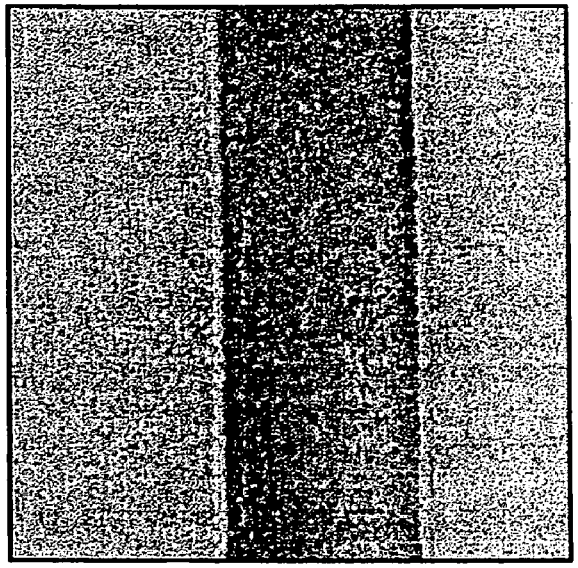
FIG. 9 is a photograph showing a photoresist pattern obtained from Example 25.

The procedure of Example 17 was repeated using the polymer (2 g) of Example 9 instead of the polymer of Example 1 to obtain the pattern of 2.50 μm of L/S pattern (see FIG. 9).

EXAMPLE 26

Figure 10:
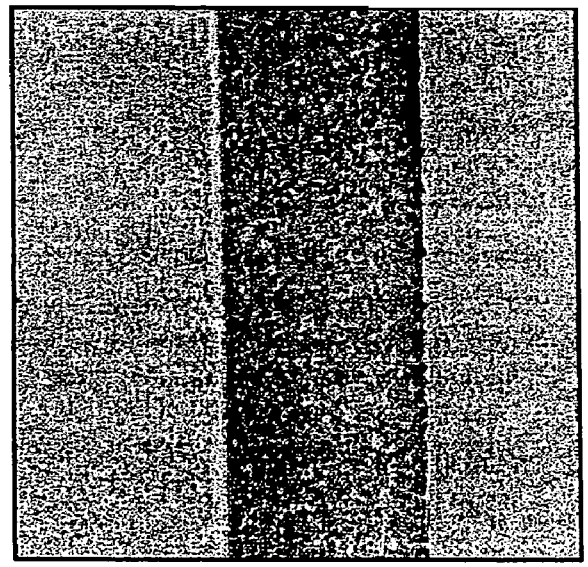
FIG. 10 is a photograph showing a photoresist pattern obtained from Example 26.

The procedure of Example 17 was repeated using the polymer (2 g) of Example 10 instead of the polymer of Example 1 to obtain the pattern of 2.50 μm of L/S pattern (see FIG. 10).

EXAMPLE 27

Figure 11:
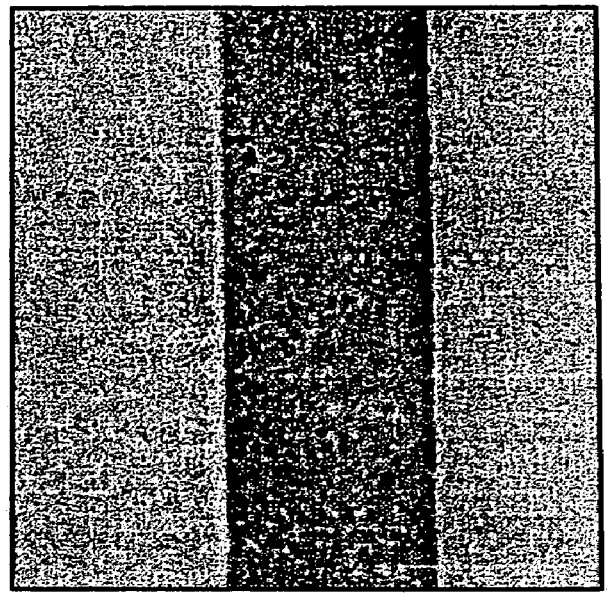
FIG. 11 is a photograph showing a photoresist pattern obtained from Example 27.

The procedure of Example 17 was repeated using the polymer (2 g) of Example 11 instead of the polymer of Example 1 to obtain the pattern of 2.50 μm of L/S pattern (see FIG. 11).

EXAMPLE 28

Figure 12:
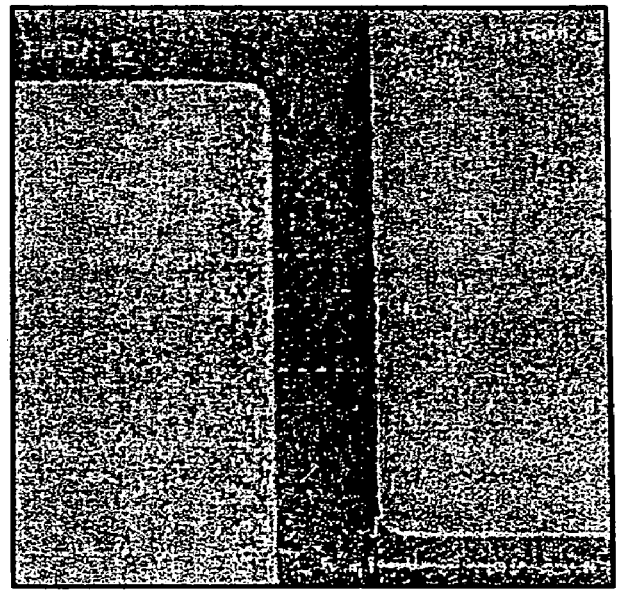
FIG. 12 is a photograph showing a photoresist pattern obtained from Example 28.

The procedure of Example 17 was repeated using the polymer (2 g) of Example 12 instead of the polymer of Example 1 to obtain the pattern of 2.50 μm of L/S pattern (see FIG. 12).

EXAMPLE 29

Figure 13:
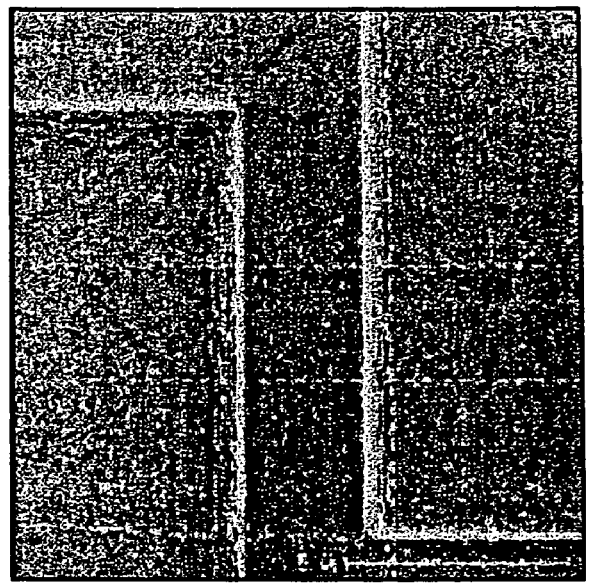
FIG. 13 is a photograph showing a photoresist pattern obtained from Example 29.

The procedure of Example 17 was repeated using the polymer (2 g) of Example 13 instead of the polymer of Example 1 to obtain the pattern of 2.50 μg/m of L/S pattern (see FIG. 13).

EXAMPLE 30

Figure 14:
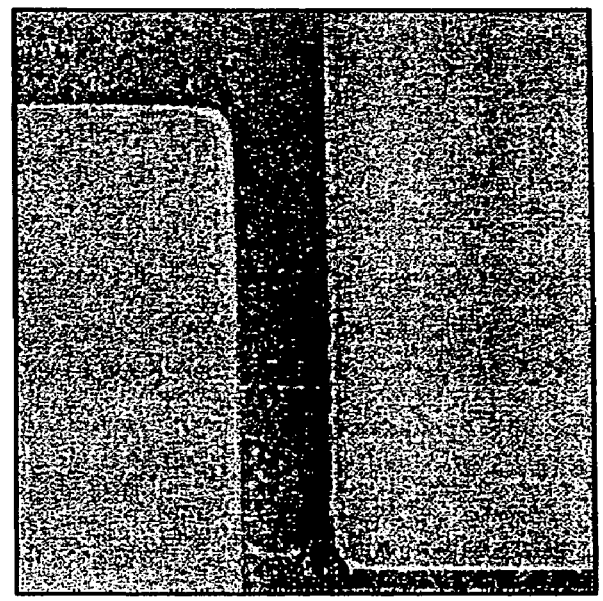
FIG. 14 is a photograph showing a photoresist pattern obtained from Example 30.

The procedure of Example 17 was repeated using the polymer (2 g) of Example 14 instead of the polymer of Example 1 to obtain the pattern of 2.50 μm of L/S pattern (see FIG. 14).

EXAMPLE 31

Figure 15:
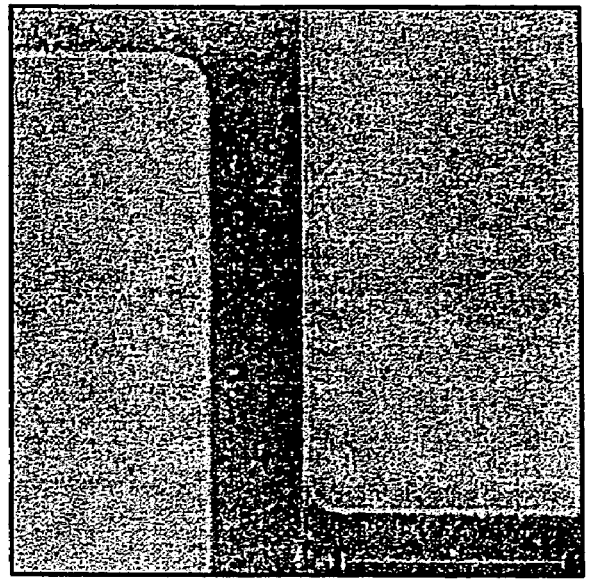
FIG. 15 is a photograph showing a photoresist pattern obtained from Example 31.

The procedure of Example 17 was repeated using the polymer (2 g) of Example 15 instead of the polymer of Example 1 to obtain the pattern of 2.50 μm of L/S pattern (see FIG. 15).

EXAMPLE 32

Figure 16:
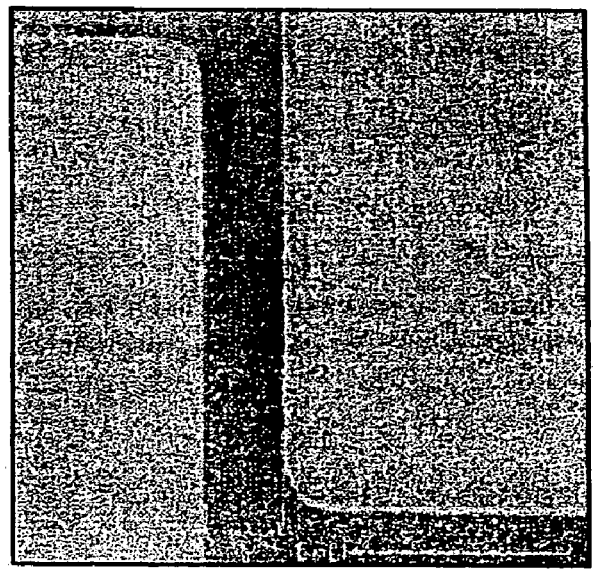
FIG. 16 is a photograph showing a photoresist pattern obtained from Example 32.

The procedure of Example 17 was repeated using the polymer (2 g) of Example 16 instead of the polymer of Example 1 to obtain the pattern of 2.50 μm of L/S pattern (see FIG. 16).

As discussed earlier, patterns having the improved LER can be obtained because the disclosed photoresist compositions including acidic alcohol groups have high affinity to basic developing solutions. Additionally, since the disclosed photoresist compositions including fluorine have low light absorbance at 193 nm and 157 nm, excellent durability, etching resistance, reproducibility and resolving power, ultra microscopic patterns of 4 G, 16 G DRAMs as well as of less than 1 G DRAM can be obtained.

What is claimed is:

1. A photoresist polymer comprising polymerization unit comprising a polymerized alcohol group-containing compound selected from the group consisting of a cyclo-olefin compound, a hydroxystyrene compound and a phenol compound in a main chain, wherein the main chain is linked to a side-chained moiety of Formula 1:

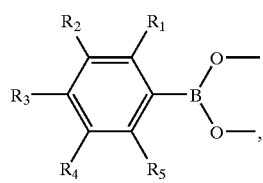

Formula 1 wherein $R_1$, $R_2$, $R_3$, $R_4$ and $R_5$ are individually selected from the group consisting of H, F, $CF_3$ and a $C_1$–$C_5$ alkyl group.

2. The photoresist polymer according to claim 1, wherein the moiety of Formula 1 is selected from the group consisting of Formulas 1a to 1d;

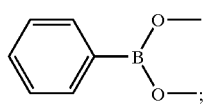

Formula 1a

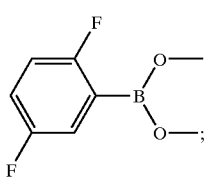

Formula 1b

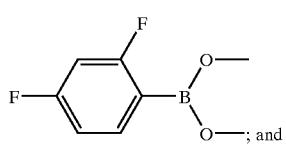

Formula 1c

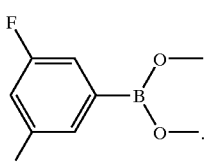

Formula 1d

3. The photoresist polymer according to claim 1, wherein the moiety of Formula 1 is present in an amount ranging from 1 to 30 mol % based on the entire polymer.

4. The photoresist polymer according to claim 1, further comprising two main chains wherein the moiety of Formula 1 is side-chained individually to the two main chains, thereby cross-linking the two main chains with the moiety of Formula 1.

5. The photoresist polymer according to claim 1, wherein the polymerization unit of the cyclo-olefin compound is represented by Formula 2:

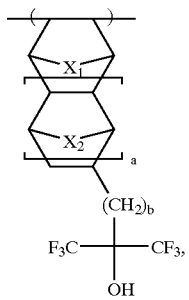

Formula 2 wherein $X_1$ and $X_2$ are individually selected from the group consisting of $CH_2$, O and S;

a is an integer ranging from 0 to 2; and b is 0 or 1.

6. The photoresist polymer according to claim 5, wherein the Formula 2 is represented by Formula 2a:

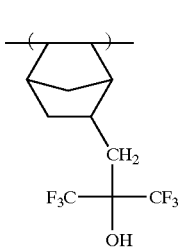

Formula 2a

7. The photoresist polymer according to claim 1, wherein the polymer comprises one or more polymerization repeating units of Formulas 3 or 4:

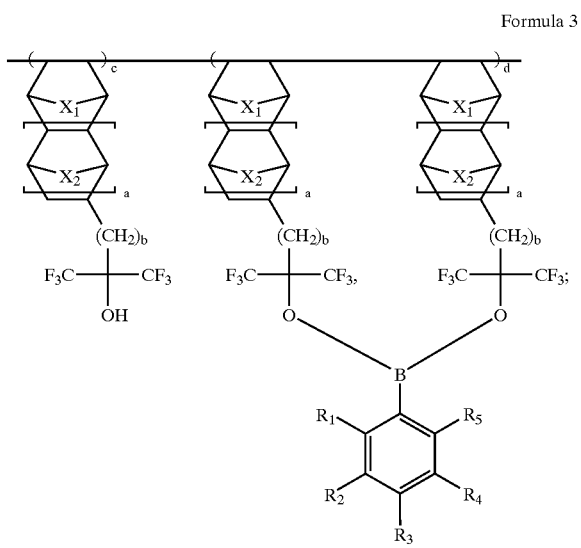

Formula 3

-continued

Formula 4

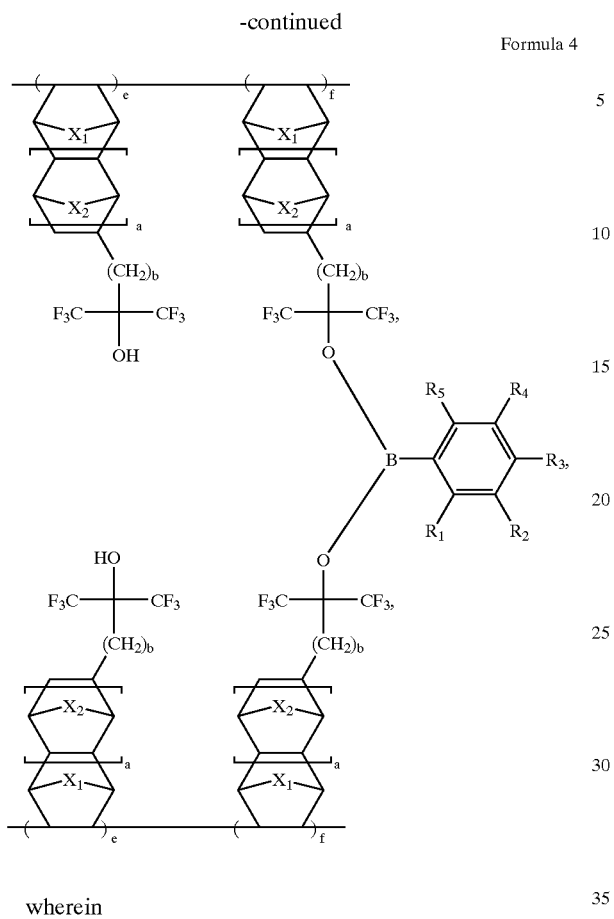

wherein
$X_1$ and $X_2$ are individually $CH_2$, O or S;
$R_1$, $R_2$, $R_3$, $R_4$ and $R_5$ are individually selected from the group consisting of H, F, $CH_3$ and a $C_1$–$C_5$ alkyl group;
a is an integer ranging from 0 to 2;
b is 0 or 1;
the relative ratio of c:d in the range of 60~90 mol %: 10~40 mol %; and
the relative ratio of e:f in the range of 60~90 mol %:10~40 mol %.

8. The photoresist polymer according to claim 7, wherein the polymerization repeating unit of Formula 3 is selected from the group consisting of Formulas 3a to 3d:

Formula 3a

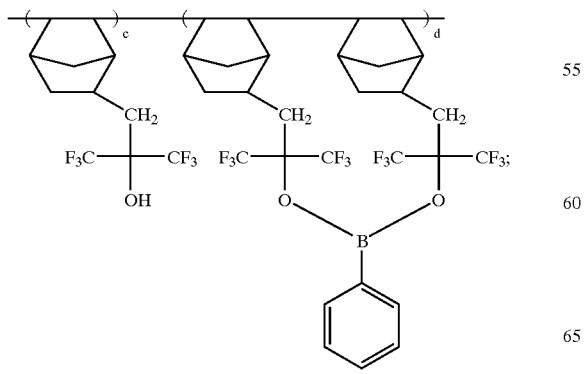

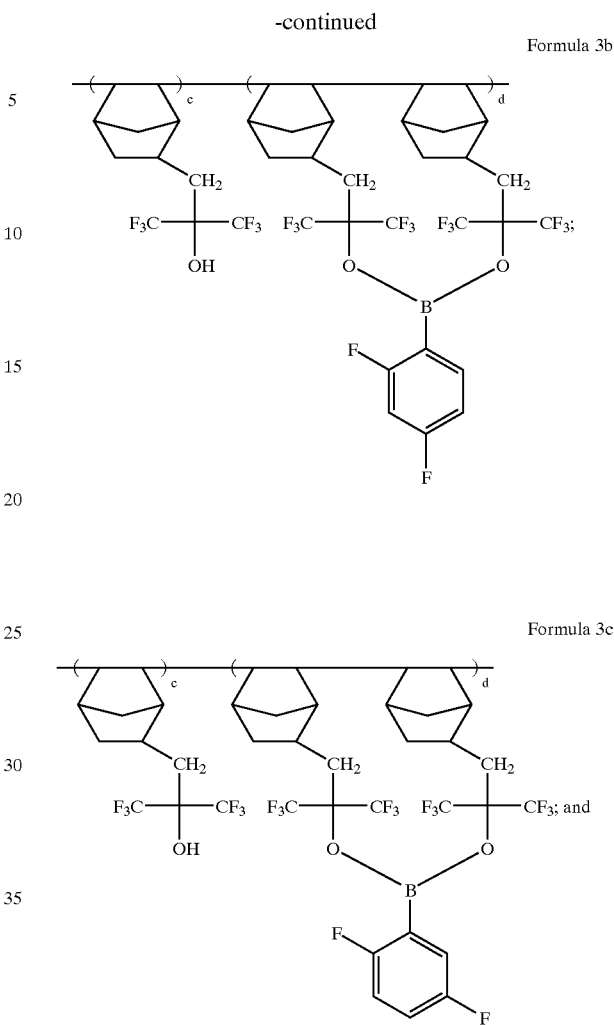

wherein the relative ratio of o:p in the range of 60~90 mol %:10~40 mol %.

9. The photoresist polymer according to claim 7, wherein the polymerization repeating unit of Formula 4 is selected from the group consisting of Formulas 4a to 4d:

Formula 4a
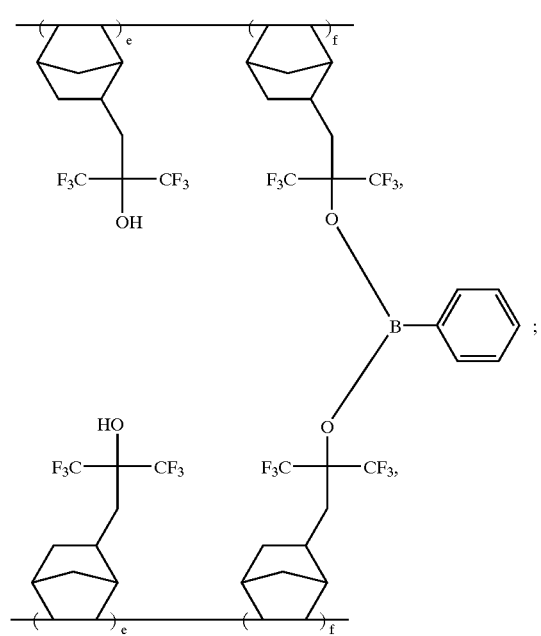
Formula 4b
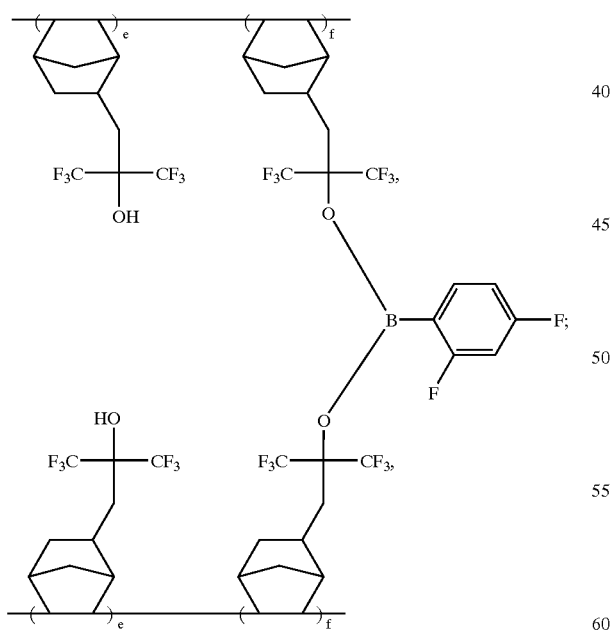
Formula 4c
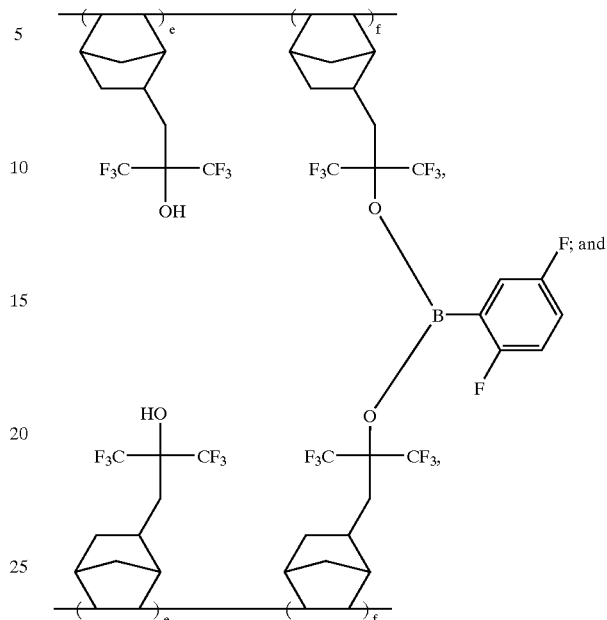
Formula 4d
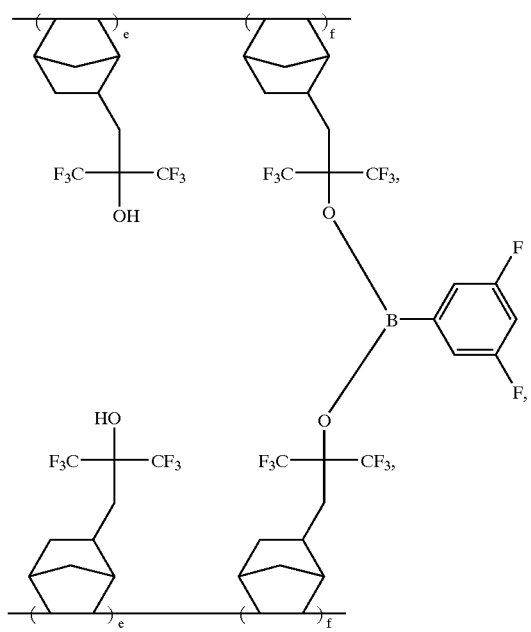

wherein the relative ratio of e:f in the range of 60~90 mol %:10~40 mol %.

10. The photoresist polymer according to claim 1, wherein the additional polymerization unit of the hydroxystyrene compound is represented by Formula 5:

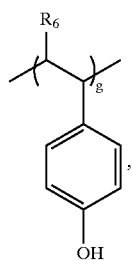

Formula 5 wherein $R_6$ is H or $CH_3$; and g is an integer ranging from 10 to 150.

11. The photoresist polymer according to claim 10, wherein the compound of Formula 5 is represented by Formula 5a:

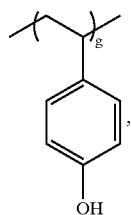

Formlua 5a wherein g is an integer ranging from 10 to 150.

12. The photoresist polymer according to claim 1, wherein the polymer comprises one or more polymerization repeating units of Formulas 6 or 7:

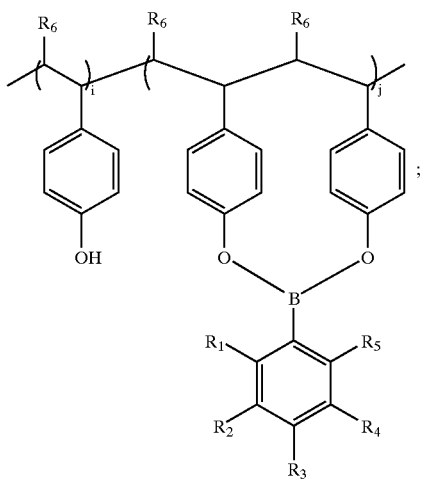

Formula 6

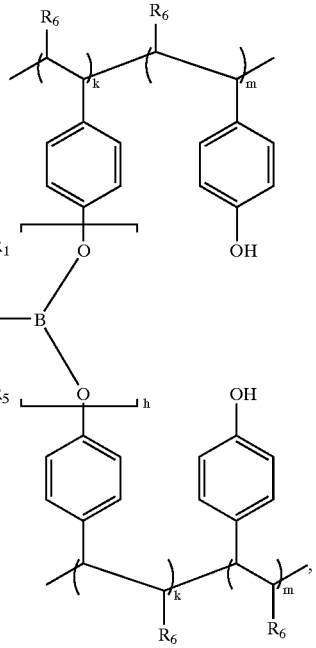

Formula 7 wherein $R_1$, $R_2$, $R_3$, $R_4$ and $R_5$ are individually selected from the group consisting H, F, $CF_3$ and a $C_1$–$C_5$ alkyl group;

$R_6$ is H or $CH_3$;

h is 1 or 2;

the relative ratio of i:j in the range of 60~90 mol %:10~40 mol %; and the relative ratio of k:m in the range of 10~40 mol %:60~90 mol %.

13. The photoresist polymer according to claim 12, wherein the polymerization repeating unit of Formula 6 is selected from the group consisting of Formulas 6a to 6d:

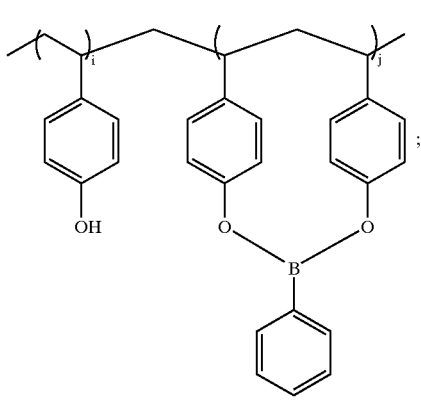

Formula 6a

-continued
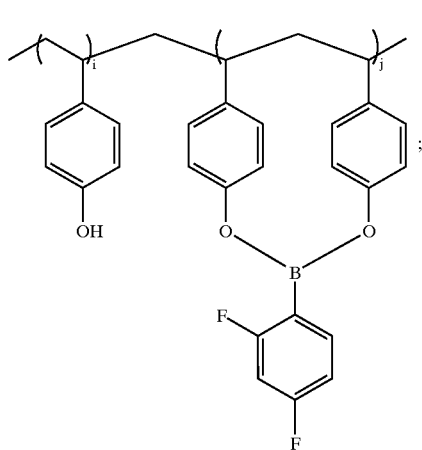
Formula 6b
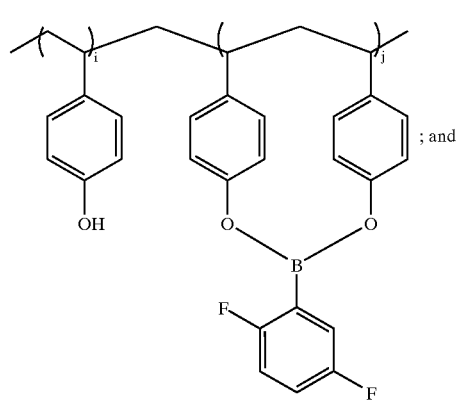
Formula 6c
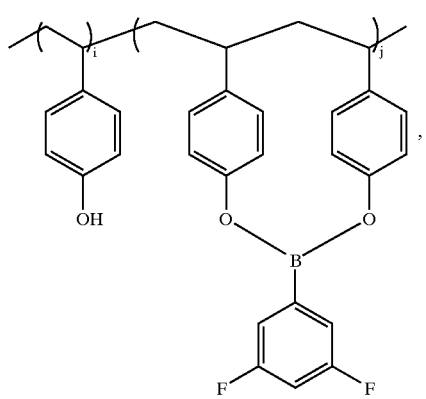
Formula 6d
wherein the relative ratio of i:j in the range of 60~90 mol %:10~40 mol %.
14. The photoresist polymer according to claim 12, wherein the polymerization repeating unit of Formula 7 is selected from the group consisting of Formula 7a to 7d:
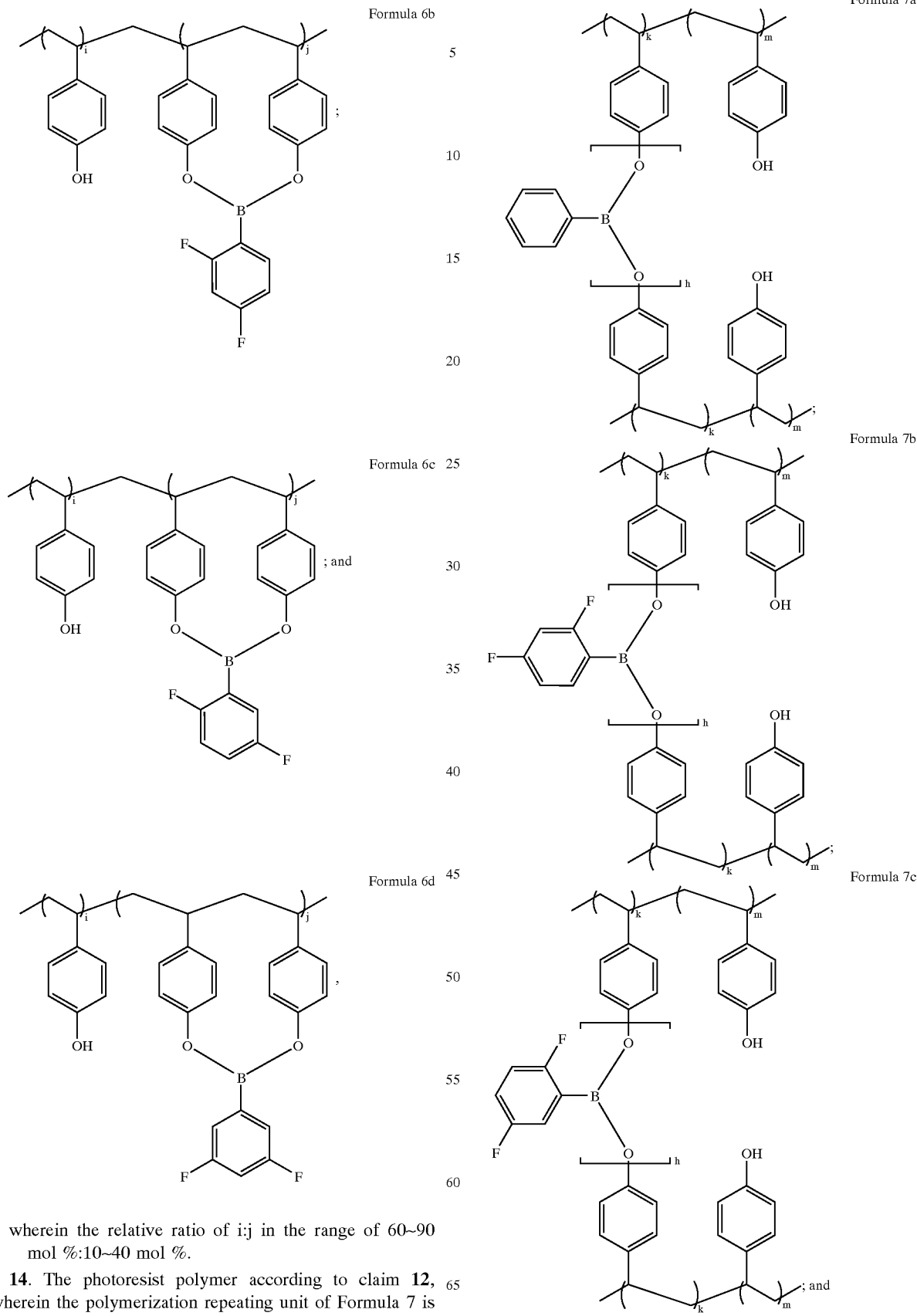

-continued

Formula 7d

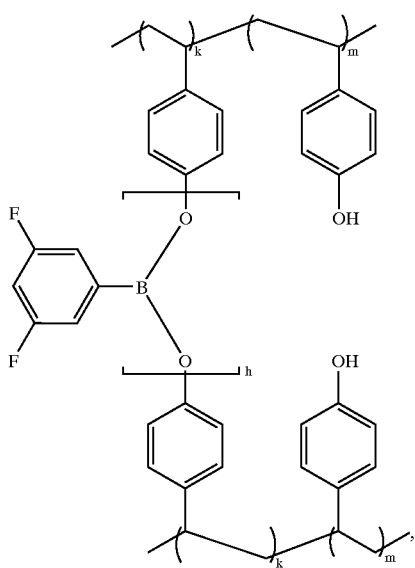

wherein h is 1 or 2; and the relative ratio of k:m in the range of 10~40 mol %:60~90 mol %.

15. The photoresist polymer according to claim 1, wherein the additional polymerization unit of the phenol compound is represented by Formulas 8 or 9:

Formula 8

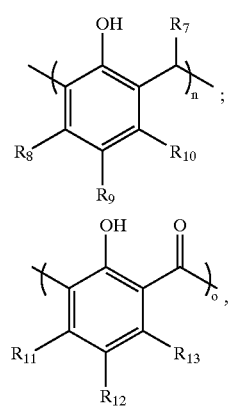

Formula 9 wherein $R_7$, $R_8$, $R_9$, $R_{10}$, $R_{11}$, $R_{12}$ and $R_{13}$ are individually selected from the group consisting of H and a $C_1$–$C_5$ alkyl group; and n and o are an integer ranging from 10 to 150.

16. The photoresist polymer according to claim 15, wherein the Formula 8 is represented by Formula 8a:

Formula 8a

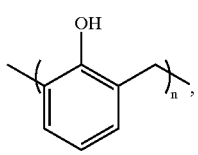

wherein n is an integer ranging from 10 to 150.

17. The photoresist polymer according to claim 15, wherein the Formula 9 is represented by Formula 9a:

Formula 9a

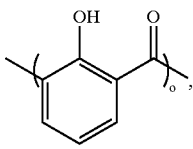

wherein o is an integer ranging from 10 to 150.

18. The photoresist polymer according to claim 1, wherein the polymer comprises one or more polymerization repeating units of Formulas 10 or 11:

Formula 10

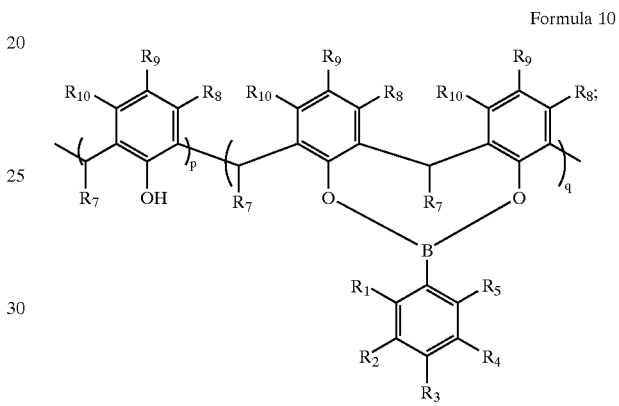

Formula 11

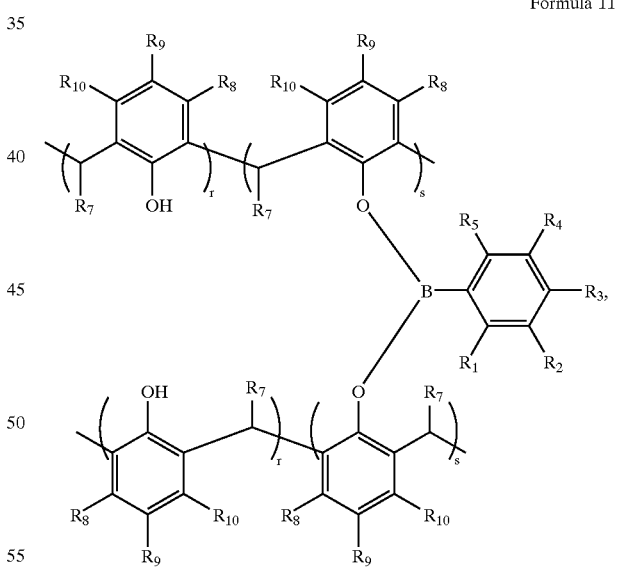

wherein $R_1$, $R_2$, $R_3$, $R_4$ and $R_5$ are individually selected from the group consisting of H, F, $CF_3$ and a $C_1$–$C_5$ alkyl group;

$R_7$, $R_8$, $R_9$ and $R_{10}$ are individually selected from the group consisting of H and a $C_1$–$C_5$ alkyl group;

the relative ratio of p:q in the range of 60~90 mol %:10~40 mol %; and the relative ratio of r:s in the range of 60~90 mol %:10~40 mol %.

19. The photoresist polymer according to claim 18, wherein the polymerization repeating unit of Formula 10 is selected from the group consisting of Formulas 10a to 10d:

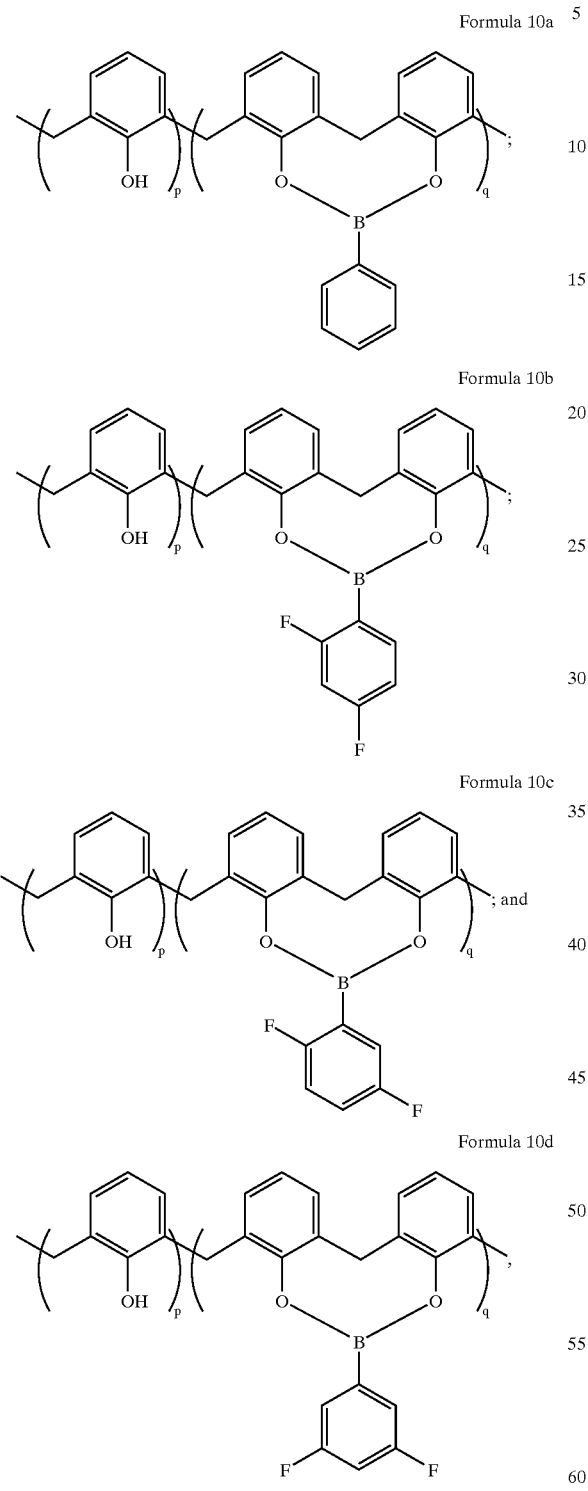

Formula 10a

Formula 10b

Formula 10c

Formula 10d wherein the relative ratio of p:q in the range of 60~90 mol %:10~40 mol %.

20. The photoresist polymer according to claim 18, wherein the polymerization repeating unit of Formula 11 is selected from the group consisting of Formulas 11a to 11d:

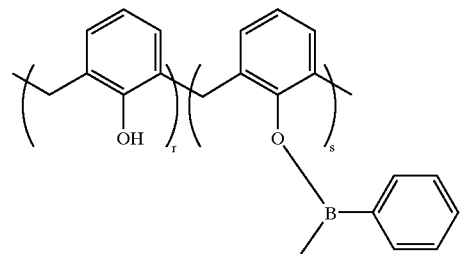

Formula 11a

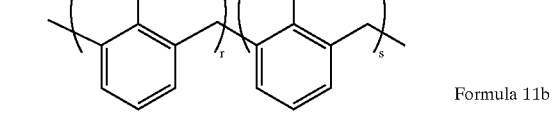

Formula 11b

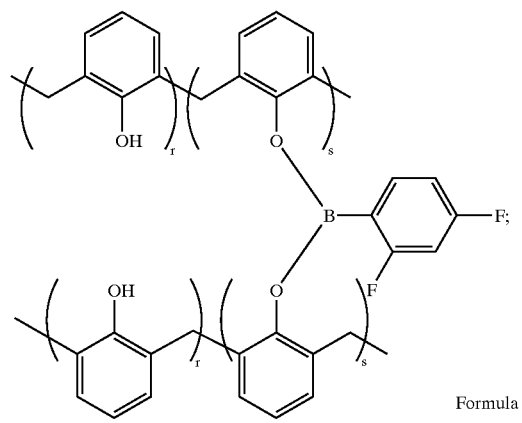

Formula 11c

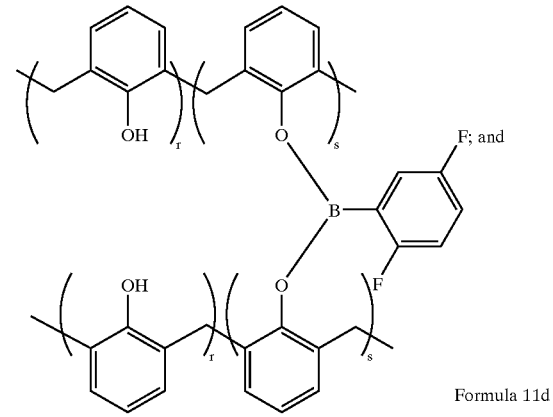

Formula 11d wherein the relative ratio of r:s in the range of 60~90 mol %:10~40 mol %.

21. The photoresist polymer according to claim 1, wherein the polymer comprises one or more polymerization repeating units of Formulas 12 or 13:

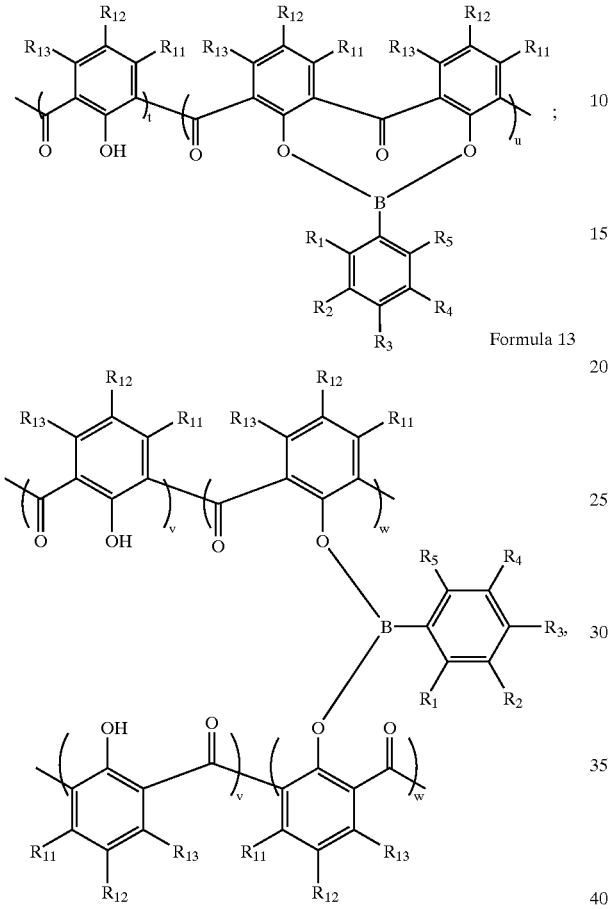

wherein
$R_1$, $R_2$, $R_3$, $R_4$ and $R_5$ are individually H, F, $CF_3$ or a $C_1$–$C_5$ alkyl group;
$R_{11}$, $R_{12}$ and $R_{13}$ are individually H or a $C_1$–$C_5$ alkyl group;
the relative ratio of t:u in the range of 60~90 mol %:10~40 mol %; and
the relative ratio of v:w in the range of 60~90 mol %:10~40 mol %.

22. The photoresist polymer according to claim 21, wherein the polymerization repeating unit of Formula 12 is selected from the group consisting of Formulas 12a to 12d:

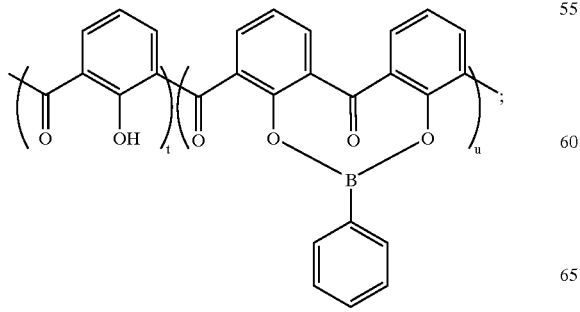

Formula 12a

-continued

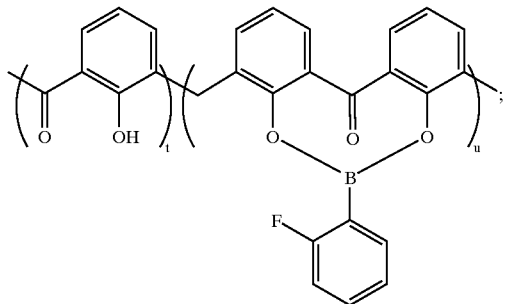

Formula 12b

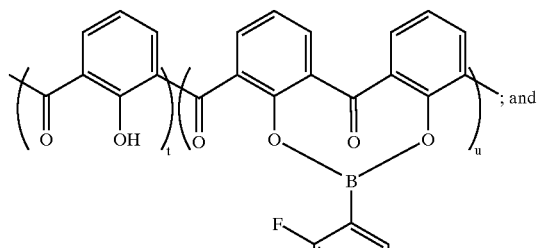

Formula 12c

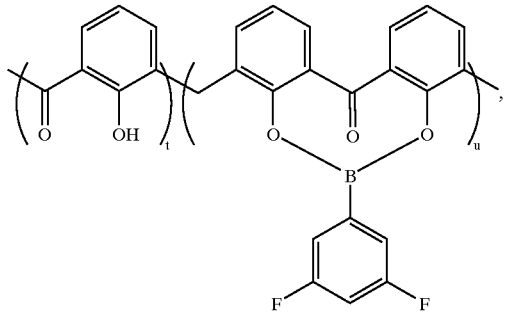

Formula 12d wherein the relative ratio of t:u in the range of 60~90 mol %:10~40 mol %.

23. The photoresist polymer according to claim 21, wherein the polymerization repeating unit of Formula 13 is selected from the group consisting of Formulas 13a to 13d:

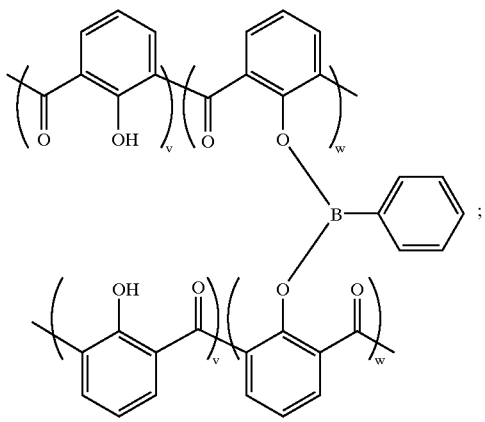

Formula 13a

-continued

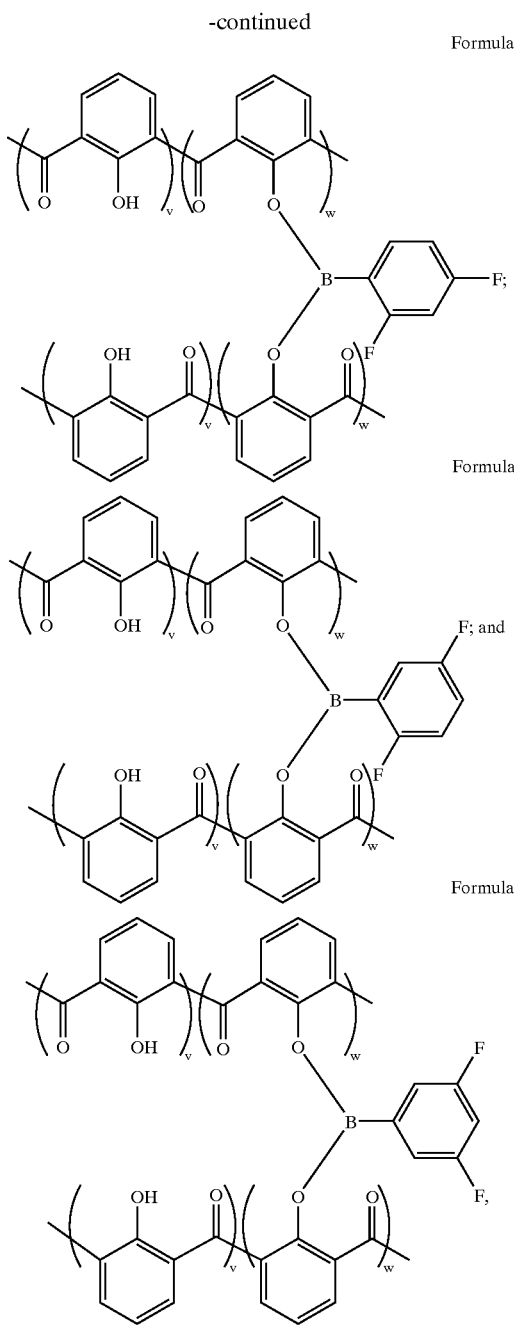

Formula 13b

Formula 13c

Formula 13d wherein the relative ratio of v:w in the range of 60~90 mol % 10~40 mol %.

24. A method for manufacturing a photoresist polymer, comprising the steps of:
  (a) mixing a compound of Formula 1e with an additional polymer of Formula 2 in an organic solvent; and
  (b) refluxing and dehydrating the resulting mixture to obtain repeating units of Formulas 3 and 4:

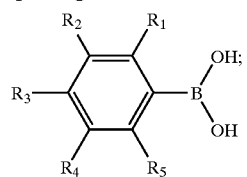

Formula 1e

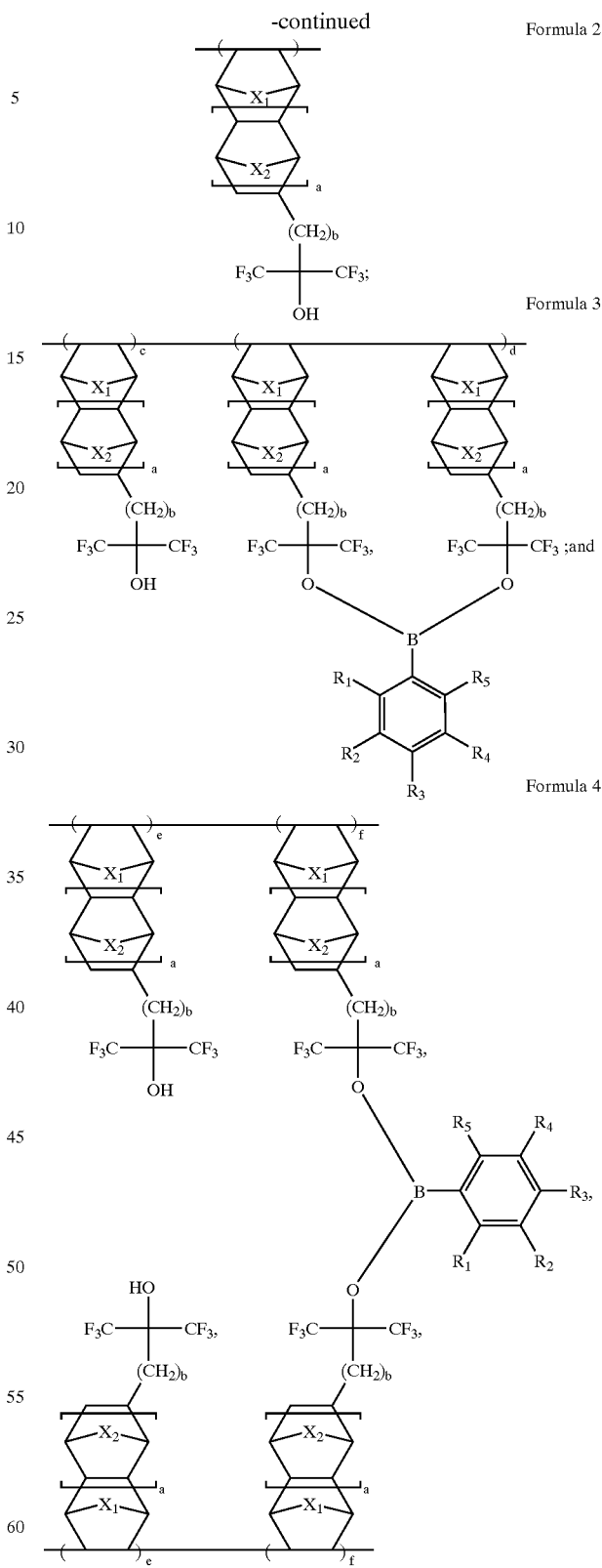

Formula 2

Formula 3

Formula 4 wherein
$X_1$ and $X_2$ are individually $CH_2$, O or S;
$R_1$, $R_2$, $R_3$, $R_4$ and $R_5$ are individually selected from the group consisting of H, F, $CH_3$ and a $C_1$–$C_5$ alkyl group;
a is an integer ranging from 0 to 2;

b is 0 or 1;
the relative ratio of c:d in the range of 60~90 mol %:10~40 mol %; and
the relative ratio of e:f in the range of 60~90 mol %:10~40 mol %.

25. A method for manufacturing a photoresist polymer comprising:
(a) mixing a compound of Formula 1e with an additional polymer of Formula 5 in an organic solvent; and
(b) refluxing and dehydrating the resulting mixture to obtain repeating units of Formulas 6 and 7:

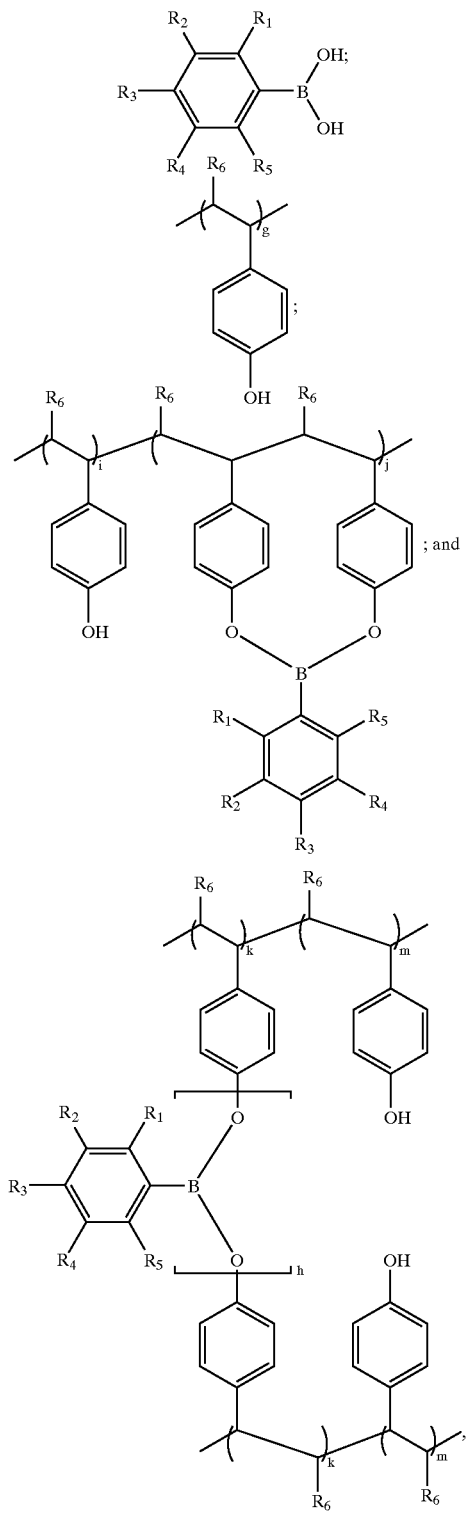

Formula 1e

Formlua 5

Formula 6

Formula 7 wherein
$R_1$, $R_2$, $R_3$, $R_4$ and $R_5$ are individually selected from the group consisting of H, F, $CF_3$ and a $C_1$–$C_5$ alkyl group;
$R_6$ is H or $CH_3$;
g is an integer ranging from 10 to 150;
h is 1 or 2;
the relative ratio of i:j in the range of 60~90 mol %:10~40 mol %; and
the relative ratio of k:m in the range of 10~40 mol %:60~90 mol %.

26. A method for manufacturing a photoresist polymer comprising:
(a) mixing a compound of Formula 1e with an additional polymer of Formula 8 in an organic solvent; and
(b) refluxing and dehydrating the resulting mixture to obtain repeating units of Formulas 10 and 11:

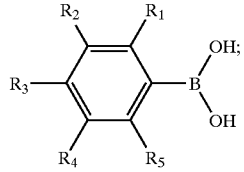

Formula 1e

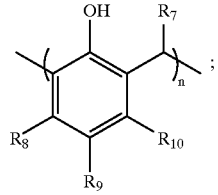

Formula 8

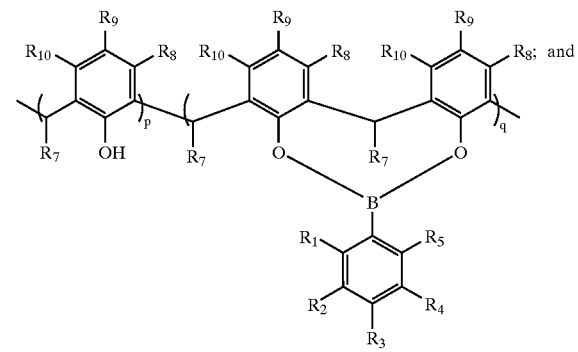

Formula 10

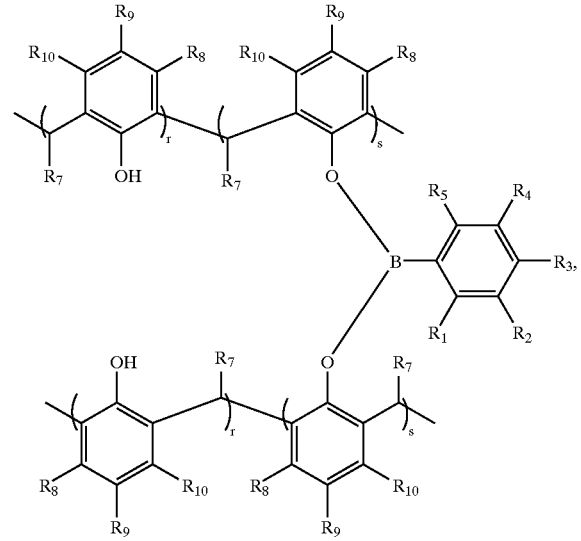

Formula 11 wherein
R$_1$, R$_2$, R$_3$, R$_4$ and R$_5$ are individually selected from the group consisting of H, F, CF$_3$ and a C$_1$–C$_5$ alkyl group;
R$_7$, R$_8$, R$_9$ and R$_{10}$ are individually selected from the group consisting of H and a C$_1$–C$_5$ alkyl group;
n is an integer ranging from 10 to 150;
the relative ratio of p:q in the range of 60~90 mol %:10~40 mol %; and
the relative ratio of r:s in the range of 60~90 mol %:10~40 mol %.

27. A method for manufacturing a photoresist polymer comprising:
(a) mixing a compound of Formula 1e with an additional polymer of Formula 9 in an organic solvent; and
(b) refluxing and dehydrating the resulting mixture to obtain repeating units of Formulas 12 and 13:

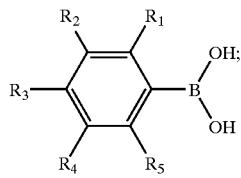

Formula 1e

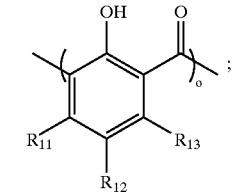

Formula 9

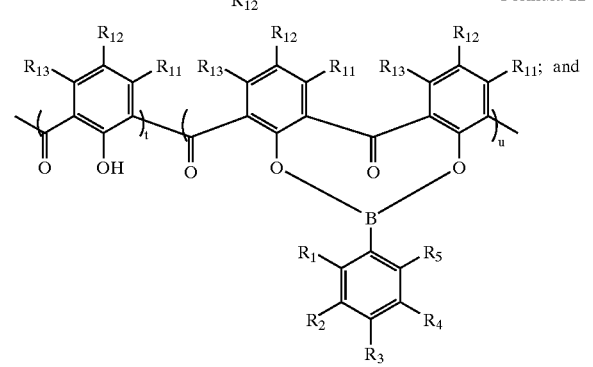

Formula 12

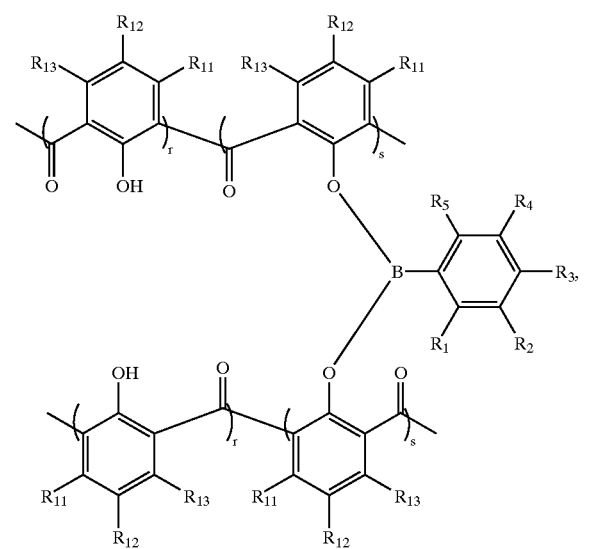

Formula 13 wherein
R$_1$, R$_2$, R$_3$, R$_4$ and R$_5$ are individually selected from the group consisting of H, F, CF$_3$ and a C$_1$–C$_5$ alkyl group;
R$_{11}$, R$_{12}$ and R$_{13}$ are individually selected from the group consisting of H and a C$_1$–C$_5$ alkyl group;
o is an integer ranging from 10 to 150;
the relative ratio of t:u in the range of 60~90 mol %:10~40 mol %; and
the relative ratio of v:w in the range of 60~90 mol %:10~40 mol %.

28. A photoresist composition comprising a photoresist polymer of claim 1, a photoacid generator and an organic solvent.

29. The photoresist composition according to claim 28, further comprising a vinylene or acrylate type polymer.

30. The photoresist composition according to claim 28, wherein the photoacid generator is selected from the group consisting of phthalimidotrifluoromethane sulfonate, dinitrobenzyltosylate, n-decyl disulfone and naphthylimido trifluoromethane sulfonate and mixtures thereof.

31. The photoresist composition according to claim 30, wherein the photoacid generator comprises:
(i) a first photoacid generator selected from the group consisting of phthalimidotrifluoromethane sulfonate, dinitrobenzyltosylate, n-decyl disulfone, naphthylimido trifluoromethane sulfonate and mixtures thereof; and
(ii) a second photoacid generator selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluoroarsenate, triphenylsulfonium hexafluoroantimonate, triphenylsulfonium triflate, dibutylnaphthylsulfonium triflate and mixtures thereof.

32. The photoresist composition according to claim 28, wherein the photoacid generator is present in an amount ranging from 0.05 to 10 wt % based on the photoresist polymer.

33. The photoresist composition according to claim 28, wherein the organic solvent is selected from the group consisting of diethylene glycol diethyl ether, methyl 3-methoxypropionate, ethyl 3-ethoxypropionate, propyleneglycol methyletheracetate, cyclohexanone, 2-heptanone and mixtures thereof.

34. The photoresist composition according to claim 28, wherein the organic solvent is present in an amount ranging from 500 to 2000 wt % based on the photoresist polymer.

35. A method for forming a photoresist pattern comprising:
(a) coating a photoresist composition of claim 28 on an underlying layer to form a photoresist film;
(b) exposing the photoresist film to a light source;
(c) baking the exposed photoresist film; and
(d) developing the resulting mixture to obtain a photoresist pattern.

36. The method according to claim 35, further comprising the step of performing a baking process before exposure of the step (b).

37. The method according to one of claim 35 or 36, wherein the baking process is performed at 70 to 200° C.

38. The method according to claim 35, wherein the light source of step (b) is selected from the group consisting of ArF, KrF and EUV (Extreme Ultra Violet), VUV (Vacuum Ultra Violet), E-beam, X-ray, ion-beam and mixtures thereof.

39. The method according to claim 35, wherein the exposing is performed with an exposure energy ranging from 0.1 to 100 mJ/cm2.

40. The method according to claim 35, wherein the developing of step (d) is performed with an alkali development solution.

* * * * *